United States Patent [19]

Mizutani

[11] Patent Number: 5,995,198
[45] Date of Patent: Nov. 30, 1999

[54] EXPOSURE APPARATUS

[75] Inventor: Hideo Mizutani, Yokohama, Japan

[73] Assignee: Nikon Corporation, Tokyo, Japan

[21] Appl. No.: 08/658,962

[22] Filed: May 31, 1996

[30] Foreign Application Priority Data

| Jun. 1, 1995 | [JP] | Japan | 7-158570 |
| Sep. 14, 1995 | [JP] | Japan | 7-262198 |
| Nov. 29, 1995 | [JP] | Japan | 7-333983 |
| Nov. 29, 1995 | [JP] | Japan | 7-333985 |

[51] Int. Cl.$^6$ .................................................. G03B 27/42
[52] U.S. Cl. ............................................. 355/53; 355/72
[58] Field of Search .................................. 355/53, 72, 75

[56] References Cited

U.S. PATENT DOCUMENTS

| 4,659,225 | 4/1987 | Takahashi | 356/358 |
| 4,780,617 | 10/1988 | Umatate et al. | 250/548 |
| 4,937,618 | 6/1990 | Ayata et al. | 355/43 |
| 4,948,254 | 8/1990 | Ishida | 356/358 |
| 4,982,227 | 1/1991 | Suzuki | 355/53 |
| 5,100,237 | 3/1992 | Wittekoek et al. | 356/401 |
| 5,117,255 | 5/1992 | Shiraishi et al. | 355/53 |
| 5,194,893 | 3/1993 | Nishi | 355/53 |
| 5,381,210 | 1/1995 | Hagiwara | 355/53 |
| 5,404,222 | 4/1995 | Lis | 356/349 |
| 5,473,410 | 12/1995 | Nishi | 355/53 |
| 5,751,403 | 5/1998 | Mizutani et al. | 355/53 |
| 5,781,277 | 7/1998 | Iwamoto | 355/53 |

FOREIGN PATENT DOCUMENTS

| 1-212436 | 8/1989 | Japan . |
| 3-3224 | 1/1991 | Japan . |
| 5-160001 | 6/1993 | Japan . |

Primary Examiner—Safet Metjahic
Assistant Examiner—John Chizmar
Attorney, Agent, or Firm—Foley & Lardner

[57] ABSTRACT

The present invention relates to an exposure apparatus for printing a predetermined pattern on a mask onto a substrate whose surface is coated with a photosensitive material such as resist. The exposure apparatus according to the present invention comprises a special alignment system which effectively suppresses interference of alignment light, offset drift, and the like which may occur due to the resist, thereby realizing highly accurate alignment.

11 Claims, 19 Drawing Sheets

IMAGE OF REFERENCE INDEX

IMAGE OF WAFER MARK WM

EXPOSURE APPARATUS

BACKGROUND OF THE INVENTION

1. Field of the Invention

The present invention relates to an exposure apparatus used in photolithography process for manufacturing, for example, semiconductor devices and liquid crystal display devices and, in particular, to an alignment system for positioning such members as mask, mask stage, substrate, and substrate stage with respect to each other.

2. Related Background Art

Most of projection exposure apparatuses with sequential exposure method currently in use incorporate therein an alignment system for optically positioning a reticle, as a mask, and a photosensitive substrate (wafer, glass plate, or the like on which a photosensitive material such as resist is coated) with respect to each other. In such an alignment system, various techniques are used. Among these various techniques, TTR (through-the-reticle) technique, in which an alignment mark (reticle mark) formed at the periphery of a circuit pattern of the reticle and an alignment mark (wafer mark) formed at each shot area on the wafer are simultaneously detected by way of a projection optical system, has been known as a highly accurate technique.

In the TTR alignment system, the relative positional displacement amount between the reticle mark and the wafer mark is measured by an alignment optical system disposed above the reticle. The position or rotational angle of at least one of the reticle and wafer is finely adjusted so as to maintain this positional displacement amount within a predetermined range. Here, the TTR alignment system includes various types.

For example, in the alignment system disclosed in Japanese Unexamined Patent Publication No. 3-3224, a correction lens for correcting axial chromatic aberration with respect to alignment light is disposed within its projection optical system. Also, a correction optical system for correcting chromatic aberration in magnification with respect to the alignment light is disposed near the reticle. In the alignment system of this publication, monochromatic light such as laser light is used as the alignment light in order to facilitate correction of chromatic aberration.

Also, in the alignment system disclosed in Japanese Unexamined Patent Publication No. 5-160001, a correction optical device (PGC) for correcting axial chromatic aberration and controlling chromatic aberration in magnification with respect to alignment light is disposed between the reticle and the mask.

On the other hand, so-called off-axis type alignment system has been known as an alignment system other than the TTR type. In the off-axis type alignment system, the wafer mark and the reticle mark are respectively observed by a wafer observation system and a reticle observation system, which are independent from each other, without the aid of a projection optical system. The wafer mark and the reticle mark are positioned outside of an effective field of the projection optical system, respectively. Thus, in the off-axis technique, the optical axis of the wafer observation system and the optical axis of the reticle observation system are widely distanced from the optical axis of the projection optical system. In other words, observation fields of the wafer observation system and reticle observation system are widely distanced from the exposure area on the wafer and the transfer target area on the reticle, respectively.

As more integration in semiconductor devices is demanded every year, smaller pattern rule (line width) has been required for the circuit pattern. The line width which can be resolved by a projection optical system has been known to become smaller in proportion to wavelength. Accordingly, in order to enable exposure of a circuit pattern with a smaller pattern rule, the wavelength of light used for the exposure is shortened. Recently, there have been proposed projection exposure apparatuses using excimer laser light derived from ArF (with a wavelength of 193 nm) and excimer laser light derived from KrF (with a wavelength of 249 nm), for example.

SUMMARY OF THE INVENTION

The object of the present invention is to provide an exposure apparatus equipped with a special alignment system which can effectively suppress interference of alignment light, offset drift, and the like which may occur due to the resist coated on the substrate surface, thereby realizing highly accurate alignment. Examples of exposure apparatuses to which the above-mentioned special alignment system is applicable include so-called stepper of one-shot exposure type, scan type in which the respective positions of the mask and substrate are relatively movable with respect to the projection optical system, and an apparatus adopting step-and-repeat technique.

After having studied the prior art noted above, the inventors have found the following problems to be overcome in order to attain the above-mentioned object.

In the projection exposure apparatus such as that mentioned above in which exposure is effected with excimer laser light (having such wavelength as 193 nm or 248 nm), the aberration of its projection optical system is suitably corrected with respect to the excimer laser light which is used as exposure light. Accordingly, when red light (with a wavelength of 600 to 800 nm) is used as alignment light in order to prevent the resist coated on the wafer from sensing the light, large chromatic aberration (axial chromatic aberration, chromatic aberration in magnification, or the like) is generated with respect to this alignment light in the projection optical system.

Accordingly, in the alignment system disclosed in Japanese Unexamined Patent Publication No. 3-3224, monochromatic light is used as alignment light, while the correction lens disposed within the projection optical system corrects the axial chromatic aberration with respect to the alignment monochromatic light.

Also, in the alignment system disclosed in Japanese Unexamined Patent Publication No. 5-160001, monochromatic light such as laser light is used as alignment light, while a correction optical device (PGC) such as phase grating is used to correct chromatic aberration generated in the projection optical system.

Thus, in the conventional TTR alignment system, it is necessary to use alignment light having a narrow wavelength width such as monochromatic light in order to suppress chromatic aberration generated in the projection optical system. Such alignment monochromatic light, however, may deteriorate accuracy in detection due to interference caused by the resist coated on the wafer and the like.

In the above-mentioned off-axis type alignment system, since the wafer is observed by means of light having a relatively broad wavelength width, the influence of the interference caused by the resist can be reduced. However, since the exposure area and the wafer observation field are widely separated from each other, the wafer mark has to be widely moved in a two dimensional manner upon alignment (thereby increasing so-called base-line amount too much). Consequently, there is a possibility that offset drift may occur between the reticle observation system and the wafer observation system in terms of configuration. When offset drift occurs, accuracy in alignment deteriorates.

The exposure apparatus according to the present invention comprises an illumination optical system for irradiating a mask having a predetermined pattern with exposure light having a predetermined wavelength; a projection optical system for projecting an image of the predetermined pattern on the mask onto a substrate whose surface is coated with a photosensitive material such as a resist having a photosensitivity with respect to the exposure light; a mask stage which holds the mask on a predetermined plane and is movable in a direction perpendicular to the optical axis of the projection optical system; and a substrate stage which holds the substrate on a predetermined plane and is movable in a direction perpendicular to the optical axis of the projection optical system. In particular, this exposure apparatus necessitates an alignment system for effecting alignment or the like of the mask and the substrate with respect to each other.

The exposure apparatus according to the present invention comprises an alignment system having a special configuration explained hereinafter.

Specifically, as shown in FIGS. 1 and 2, the alignment system comprises a first mark detection optical system (substrate mark detection optical system) which guides first detection light having a wavelength different from that of the exposure light to a substrate mark WM without making it pass through a projection optical system 3 and guides the first detection light from the substrate mark WM to a first light-receiving surface 33A without making it pass through the projection optical system 3 and a second mark detection optical system (mask mark detection optical system) which guides second detection light having a wavelength different from that of the exposure light to a mask mark MM after making it pass through the projection optical system 3 and guides the second detection light from the mask mark MM to a second light-receiving surface 9A. According to this configuration, the alignment system shown in FIG. 1 detects at least the relative position of a substrate 5 and a mask 4 with respect to each other.

Preferably, the first and second mark detection optical systems are optical systems having a common optical axis and constitute an alignment coaxial optical system 1 having a configuration shown in FIG. 2. According to this configuration, the lowering of alignment accuracy caused by fluctuation in the optical axis of each detection optical system can be prevented from occurring, while offset drift is effectively prevented from occurring, thereby enabling stable alignment. Also, preferably, in order to prevent the photosensitive material coated on the substrate 5 from sensing the first detection light, the first detection light is composed of light having a broad-band wavelength different from that of the exposure light. When the substrate mark WM is detected by means of the light having a broad-band wavelength without the aid of the projection optical system 3, the interference light which may be generated by the resist can be reduced. Furthermore, it is preferable the second detection light is a monochromatic light because the second detection light passes through the projection optical system. By using the monochromatic light as the second detection light, chromatic aberration within the projection optical system can be corrected easily. The second detection light also has a predetermined wavelength different from that of the exposure light in order to prevent the sensing of the photosensitive material with respect to the second detection light. Here, "light having a broad-band wavelength" refers to light whose coherent length is shorter than the thickness (e.g., about 1 $\mu$m) of the resist coated on the substrate. Also, "monochromatic light" refers to light whose coherent length is longer than the resist thickness.

The first mark detection optical system is constituted by a first light source system for supplying first detection light (including a light source 30 for supplying light having a broad-band wavelength); a deflecting member 2 which is provided in a space between the projection optical system 3 and a first plane P1, at which the substrate 5 is to be disposed, and deflects the advancing direction of the first detection light emitted from the first light source system so as to guide the first detection light to the substrate mark WM; and an image detection optical system (including an image pickup device 33 with the first light-receiving surface 33A) which receives the first detection light from the substrate mark WM and detects an image of the substrate mark WM on the basis of thus received first detection light.

In particular, in this exposure apparatus, an illumination area A2 of an illumination optical system 11 on the substrate 5 is positioned within an effective field A1 of the projection optical system 3 on the substrate 5, while the illumination area A2 of the illumination optical system 11 is smaller than the effective field A1 of the projection optical system 3. Also, the detection field of the first mark detection optical system is positioned at an area within the effective field A1 of the projection optical system on the substrate 5 excluding the illumination area A2 of the illumination optical system 11. According to this configuration, it is not necessary to move the substrate 5 in order to detect the substrate mark WM, whereby offset drift which may occur in the conventional off-axis technique can be effectively eliminated. Namely, when the detection field of the first mark detection optical system is set within the above-mentioned area, the relative distance of the mark detection optical system and the projection optical system from each other (so-called base-line amount) can be reduced.

Also, the deflecting member 2 is a surface for reflecting the second detection light toward the surface of the second detection light and comprises a reflective surface 2a which is inclined with respect to an optical axis AX of the projection optical system 3 by a predetermined angle and a light-transmitting portion 2b which is an opening for transmitting the second detection light therethrough and provided at a predetermined position in the reflective surface 2a. Accordingly, the second detection light guided to the surface of the substrate 5 by the reflective surface 2a is regularly reflected by the surface of the substrate 5. Thus regularly reflected second detection light is transmitted through the light-transmitting portion 2b. The second detection light transmitted through the light-transmitting portion 2b is made incident on the projection optical system 3 from its surface facing the substrate. In this case, the reflective surface 2a is preferably a total reflection surface. It is due to the fact that loss in light quantity of each detection light can be minimized thereby to improve accuracy in detection of the mark or the like. Further, this deflecting member 2 comprises a first member 2A which is provided at an area through which the exposure light emitted from the projection optical system 3 passes and made of a material through which the exposure light and the second detection light can be transmitted and a second member 2B which is provided at a position deviated from the area through which the exposure light passes and made of a material through which the first detection light and second detection light can be transmitted.

The reflective surface 2a is directly held by the first and second members 2A and 2B. According to this configuration, the reflective surface 2a can be stably held. Further, since the deflecting member 2 is positioned in a space between the projection optical system 3 and the substrate 5, the area in which the second detection light is directly propagated through the atmosphere outside of the deflecting member 2 decreases. Accordingly, it becomes difficult for the second detection light to be influenced by turbulence in the air, whereby accuracy in positional detection of the mark or the like improves.

The second mark detection optical system (mask mark detection optical system) comprises a second light source system (including a light source 20) for supplying the second detection light; a photodetector 9 (opto-electric device 9 having the second light-receiving surface 9A) for detecting the second detection light from the mask mark MM; and a correction mechanism which is disposed between a second plane P2, at which the mask 4 is to be disposed, and the first plane P1, at which the substrate 5 is to be disposed, and effectively corrects chromatic aberration of the projection optical system 3 with respect to the second detection light. In this case, when the second detection light is monochromatic light, correction of chromatic aberration in the projection optical system becomes easy. Also, this second mark detection optical system receives the second detection light from the mask mark MM so as to detect this mask mark. The mask mark MM is made as chromium or the like is etched. Unlike the substrate mark WM coated with the resist, the mask mark MM yields no error even when detected by means of monochromatic light.

The mask mark MM is made of a diffraction grating having a predetermined pitch arranged along a predetermined direction (see FIG. 7 and FIG. 10). The second light source system includes a two-luminous-flux generating system for generating a pair of coherent light components as the second detection light (see FIG. 2). The photodetector 9 receives diffracted light generated by the pair of coherent light components irradiating the diffraction grating respectively from predetermined two directions.

The first and second mark detection optical systems (substrate detection optical system and mask mark detection optical system) in the alignment system of FIG. 1 are constituted by the coaxial optical system 1 having a common optical axis for them. As a modified example of this alignment system, however, the photodetector (image pickup device 33) of the first image detection system for detecting the image of the substrate mark WM and the photodetector 9 of the second image detection system for detecting the image of the mask mark MM may be commonly used. Namely, as shown in FIG. 8, the second mark detection optical system may be configured such that the second detection light guided to the mask mark MM is transmitted through the projection optical system 3 and then guided to the light-receiving surface 33A of the image pickup device 33 which acts as the light-receiving surface of the photodetector in the first mark detection optical system. Specifically, the two-luminous-flux light source system 90 having a structure shown in FIG. 3 may be disposed at the position of the image pickup device 9 in FIG. 1 such that the image of the mask mark MM is detected by the image pickup device 33 within the coaxial optical system 1 instead of the photodetector 9.

The alignment system shown in FIG. 11 comprises a first mark position detection system (substrate mark position detection system) which utilizes a substrate mark WM disposed on a substrate 207 and a first reference index 251 so as to specify the position of the substrate mark WM; a first stage position detection system (substrate stage position detection system) which utilizes a substrate stage mark 210 disposed on a first stage 208 (substrate stage) and a second reference index 205c so as to specify the position of the first stage 208; and a first holding member 205 which, while holding the first reference index 251 and the second reference index 205c, prevents the disposed positions of the first reference index 251 and second reference index 205c from relatively fluctuating with respect to each other. According to this configuration, the alignment system of FIG. 11 detects at least the position of the substrate 207. In particular, in this case, offset drift due to the relative displacement between two reference elements (first reference index 251 and second reference index 205c) is prevented from occurring between the first substrate mark position detection system and the first stage position detection system. As a result, in this exposure apparatus, the position of the substrate 207 can be detected with a high accuracy. Also, the first holding member 205 holding the first and second reference indexes 251 and 205c is fixed to a predetermined portion of a projection optical system 204 by a holding mechanism (supporting member 252).

The first stage position detection system includes an interferometer 209 which makes measurement light, which is propagated through a measurement light path including the movable reflector 210 (mirror) fixed at a predetermined position of the first stage 208, and reference light, which is propagated through a reference light path including the stationary reflector 205c (mirror) whose position with respect to the projection optical system 204 is defined, interfere with each other and then, based on interference light thus obtained, specifies the position of the first stage 208 with respect to the projection optical system 204. In particular, the substrate stage mark includes the reflective surface of the movable reflector 210 in the interferometer, while the second reference index includes the reflective surface 205c of the stationary reflector in the interferometer.

The first mark position detection system is constituted by a light source system (including a light source 230) for supplying illumination light which has a wavelength different from that of the exposure light and with which the substrate mark WM and the first reference index 251 are to be irradiated; the first reference index 251 held by the first holding member 205; and an image detection optical system (including an image pickup device 233 having a light-receiving surface 233A) which receives the illumination light from the substrate mark WM and then, based on thus received illumination light, detects an image of the substrate mark (see FIG. 12).

Here, the first reference index 251 is disposed at a position which is optically conjugate with the substrate mark WM. This arrangement is attained in order to simultaneously observe the image of the substrate mark WM and the image of the first reference index 251 under a favorable imaging condition. The first position detection system specifies the position of the substrate mark WM on the basis of the images of the substrate mark and first reference index formed by way of the image detection optical system. Preferably, the first holding member 205 comprises an optical member which can transmit therethrough at least the illumination light from the above-mentioned light source system.

Further, this configuration is also applicable to the positional detection of a mask 201. In this case, the alignment system comprises a second mark position detection system (mask mark position detection system, equivalent of the substrate mark position detection system) which utilizes a mask mark MM disposed on the mask 201 and a third reference index (equivalent of the first reference index 251) so as to specify the position of the mask mark MM; a second stage position detection system (mask stage position detection system) which utilizes a second stage mark (equivalent of the first stage mark 210) disposed on a second stage 202 (mask stage) and a fourth reference index (equivalent of the second reference index 205c) so as to specify the position of the second stage 202; and a second holding member (equivalent of the first holding member 205) which, while holding the third reference index and the fourth reference index, prevents the disposed positions of the third reference index and fourth reference index from relatively fluctuating with respect to each other. This configuration is the same as a part of the configuration of FIG. 11 concerning the first stage 208. Also, the second holding member is fixed at a predetermined position of the projection optical system 204 by means of a supporting member (equivalent of the supporting member 252).

Next, the alignment system shown in FIG. 18 comprises a first stage position detection system (substrate stage position detection system) which utilizes a first stage mark 306 disposed at a predetermined position of a first stage 308 (substrate stage) and a first reference index 305 so as to specify the position of the first stage 308; a second stage position detection system (mask stage position detection system) which utilizes a second stage mark 302 disposed at a second stage 311 (mask stage) and a second reference index 303 so as to specify the position of the second stage 311; a holding mechanism which, while holding the first reference index 305 and the second reference index 303, prevents the disposed positions of the first reference index 305 and second reference index 303 from relatively fluctuating with respect to each other; a first mark detection optical system (substrate mark detection optical system) which guides first detection light having a wavelength different from that of the exposure light to a substrate mark WM without making it pass through a projection optical system 304 and guides the first detection light from the substrate mark WM to a first light-receiving surface (light-receiving surface 333A of an image pickup device 333) without making it pass through the projection optical system 304; and a second mark detection optical system (mask mark detection optical system) which guides second detection light having a wavelength different from that of the exposure light to a mask mark MM without making it pass through the projection optical system 304 and guides the second detection light from the mask mark MM to a second light-receiving surface (light-receiving surface of an image pickup device equivalent to the image pickup device 333) without making it pass through the projection optical system 304. According to this configuration, the alignment system detects at least the relative position of the first stage 308 and the second stage 311 with respect to each other.

In this alignment system, since the first reference index 305 and the second reference index 303 are unitedly held by the holding mechanism, offset drift due to the relative displacement between two reference elements is hard to occur between the first and second stage position detection systems. As a result, in this exposure apparatus, the accuracy in positional detection in the second stage position detection system (mask position detection system) is prevented from lowering, whereby a substrate 307 and a mask 301 can be aligned with respect to each other with a high accuracy.

Here, the first and second mark detection optical systems are configured similar to the above-mentioned mark detection optical system 206 (see FIG. 11). Also, in the alignment system of FIG. 18, the positions of the stages 308 and 311 are detected by first and second interferometers 315 and 314, respectively. Accordingly, the first reference index 305 corresponds to the stationary reflector of the first interferometer 315; the first stage mark 306 corresponds to the movable reflector of the first interferometer 315; the second reference index 303 corresponds to the stationary reflector of the second interferometer 314; and the second stage mark 302 corresponds to the movable reflector of the second interferometer 314. Further, in this alignment system, as shown in FIG. 18, the holding mechanism is realized as the stationary reflectors (first and second reference indexes 305 and 303) of the interferometers 315 and 314 are fixed to the tube of the projection optical system 304.

An applied example of this holding mechanism may be realized by a mechanism shown in FIG. 20. Namely, the second stage mark is formed by a first diffraction grating 347 having a predetermined pitch arranged along a predetermined direction, while the second reference index is formed by a second diffraction grating 360 having a predetermined pitch arranged along a direction corresponding to the predetermined direction. Also, the second stage position detection system comprises a two-luminous-flux generating system (beam transmission system 340) for generating a pair of detection light components which are coherent light and a pair of reference light components which are coherent light and photodetectors 342 and 343 which respectively receive diffracted light from the first diffraction grating 347 with respect to the pair of detection light components and diffracted light from the second diffraction grating 360 with respect to the pair of reference light components. Accordingly, based on output information from the photodetectors 342 and 343, the second stage position detection system specifies the position of the second stage 311 with respect to the projection optical system 304. Here, the diffraction efficiency of the second diffraction grating 360 with respect to exposure light is substantially zero. The purpose of this feature is to prevent the imaging performance of the projection optical system 304 from being unfavorably influenced thereby.

According to the configuration shown in FIG. 20, since a reference element 341 is disposed within the projection optical system 304, offset drift is further prevented from occurring as compared with the holding mechanism of FIG. 18. Also in the case where a lens in the upper portion of the tube in the lens group constituting the projection optical system 304 is moved (tilted or shifted) to correct magnification, a configuration in which the reference element 341 is disposed within the projection optical system 304 is preferable since the reference element 341 is hard to be influenced by the movement of the lens.

Next, the alignment system shown in FIG. 25 comprises a first stage position detection system (substrate position detection system) which utilizes a first stage position detection member 408a disposed at a first stage 408 (substrate stage) and a first reference member 405 (reflective surface 405a) disposed in a space defined by a first plane P1, at which a substrate 417 is to be disposed, and a second plane P2, at which a mask 416 is to be disposed, while being positioned between a projection optical system 404 and the first plane P1, so as to detect the position of the first stage 408 and a relative displacement detection system which detects the relative displacement of a second reference member 406, which is disposed in a space defined by the first plane P1 and second plane P2 while being positioned between the projection optical system 404 and the second plane P2, and the first reference member 405 with respect to each other. This relative displacement detection system detects, in the first reference member 405 and the second reference member 406, at least the first reference member 405 by way of the projection optical system 404. According to this configuration, the alignment system can correct the position of at least the first stage 408.

This alignment system further comprises a second stage position detection system (mask stage position detection system) which utilizes a second stage position detection member 402a disposed at a second stage 402 (mask stage) and a second reference member 406 (reflector 407) so as to detect the position of the second stage 402. The alignment system shown in FIG. 25 detects the positions of the stages 408 and 402 by the first and second interferometers 409 and 411, respectively. Accordingly, the first reference member 405 (reflective surface 405a) corresponds to the stationary reflector of the first interferometer 409; the first stage position detecting member 408a corresponds to the movable reflector of the first interferometer 409; the second reference member 406 (reflector 407) corresponds to the stationary reflector of the second interferometer 411; and the second stage position detecting member 402a corresponds to the movable reflector of the second interferometer 411. According to this configuration, the alignment system of FIG. 25 adjusts the relative position of the mask and the substrate with respect to each other with a high accuracy.

Here, the second reference member 406 unitedly holds a second reference index 403a (disposed at a reference element 403 which is fixed to the member 406) and the stationary reflector 407. In particular, this second reference member 406 fixes the relative position of the second stationary reflector 407 with respect to the second reference index 403a. Also, the above-mentioned relative displacement detection system detects the relative displacement of a first reference index 414 and the second reference index 403a with respect to each other by way of the projection optical system 404.

Preferably, the first reference index 414 is a first diffraction grating having a predetermined pitch arranged along a predetermined direction, while the second reference index 403a is a second diffraction grating having a predetermined pitch arranged along a predetermined direction. Accordingly, the relative displacement detection system irradiates each of the first diffraction grating 414 and the second diffraction grating 403a with detection light and, based on diffracted light from the first diffraction grating 414 and diffracted light from the second diffraction grating 403a, detects the relative position of the first diffraction grating 414 and the second diffraction grating 403a with respect to each other. Preferably, the first reference member 405 is fixed to the projection optical system 404 by means of a holding mechanism 405A for fixing the relative position of the first reference member 405 and the projection optical system 404 with respect to each other. In order to maintain accuracy in detection, at least one of the first and second diffraction gratings is preferably positioned on a plane which is optically conjugate with the substrate surface. This arrangement is advantageous in that the relative displacement of the first reference index and the second reference index with respect to each other can be detected further accurately in a state where the projection optical system 404 has a nearly favorable condition. Also, the relative displacement detection system detects the relative position of the first diffraction grating 414 and the second diffraction grating 403a with respect to each other on the basis of the diffracted light from the first diffraction grating 414 and the diffracted light from the second diffraction grating 403a generated by the detection light which irradiates the first diffraction grating 414 after being transmitted through the second diffraction grating 403a and the projection optical system 404.

In the present invention, as explained in the foregoing, the relative displacement of the first reference index 414 and the second reference index 403a with respect to each other, namely, the relative displacement of the first stationary reflector (corresponding to 405a in drawings) and the second stationary reflector (corresponding to 407 in drawings) with respect to each other, is detected by way of the projection optical system 404 and the influence of thus detected relative displacement is corrected, whereby the alignment of the mask 416 and the substrate 417 with respect to each other can be effected with a high accuracy. In other words, based on the results of measurement by the interferometers 409 and 411 and information about the relative displacement of the first stationary reflector and the second stationary reflector with respect to each other, highly accurate alignment which is equivalent to so-called TTL (through-the-lens) type alignment by way of the projection optical system 404 can be realized.

Accordingly, in the exposure apparatus according to the present invention, even when vibration occurs in the apparatus due to a scanning operation during exposure thereby generating relative dislocation between the first and second stationary reflectors or between the projection optical system and each stationary reflector, highly accurate alignment can be effected at any time during the exposure.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

In the following, first to fourth embodiments of the exposure apparatus according to the present invention will be explained with reference to FIGS. 1 to 26.

Figure 1:
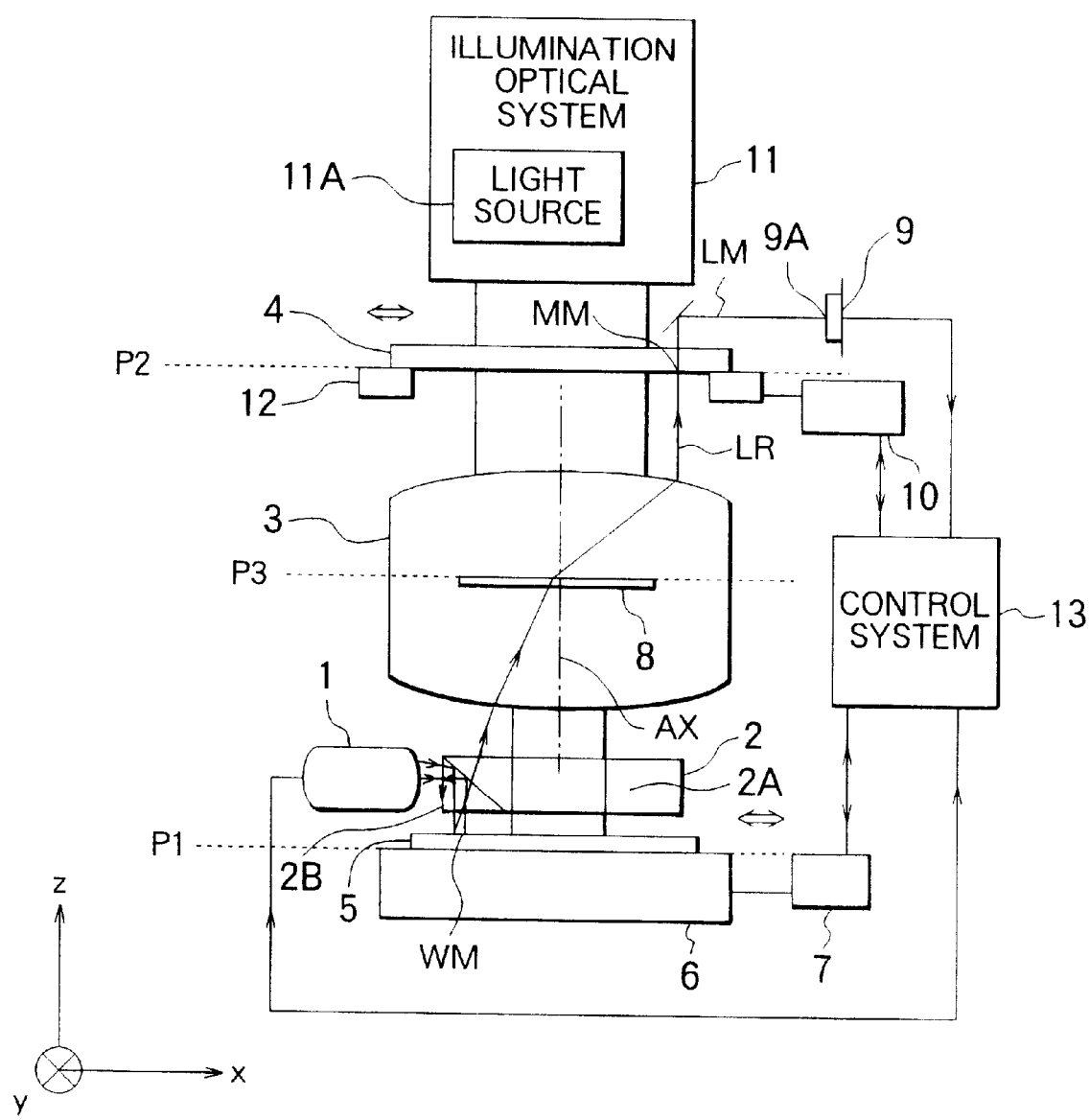
FIG. 1 is a view showing a configuration of a first embodiment of the exposure apparatus according to the present invention.

FIG. 1 is a view schematically showing a configuration of the first embodiment of the exposure apparatus according to the present invention. Here, this embodiment is shown as so-called lens scan type projection exposure apparatus in which exposure is effected while each of a mask and a substrate (referred to as "wafer" hereinafter) is relatively moved with respect to a projection optical system.

In FIG. 1, z axis is set in parallel to an optical axis AX of a projection optical system 3; x axis is set in parallel to the paper surface of FIG. 1 within a plane perpendicular to the optical axis AX; and y axis is set to a direction perpendicular to z axis and x axis.

The projection exposure apparatus of FIG. 1 comprises an illumination optical system 11 for uniformly illuminating a mask 4 with exposure light such as excimer laser light (with a wavelength of 249 nm or 193 nm) derived from KrF or ArF. This illumination optical system 11 includes a light source 11A for supplying the exposure light. The mask 4 is supported on a mask stage 12 (second stage). The mask stage 12 is two-dimensionally movable within xy plane which is perpendicular to the optical axis AX of the projection optical system 3. The x-direction moving amount and y-direction moving amount of the mask stage 12 and, accordingly, those of the mask 4 are always measured by a laser interferometer 10. The output of the laser interferometer 10 is supplied to a control system 13. The configuration of a laser interferometer applicable to the present invention is disclosed, for example, in U.S. Pat. No. 4,948,254 and U.S. Pat. No. 5,404,222.

Light transmitted through the mask 4, in which a circuit pattern, for example, has been formed, reaches a wafer 5, which is a photosensitive substrate, by way of the projection optical system 3, whereby a pattern image of the mask 4 is formed on the wafer 5.

Here, the wafer 5 is supported on a wafer stage 6 (first stage) by way of a wafer holder. The wafer stage 6 is two-dimensionally driven within xy plane which is perpendicular to the optical axis AX of the projection optical system 3. The x-direction moving amount and y-direction moving amount of the wafer stage 6 and, accordingly, those of the wafer 5 are always measured by a laser interferometer 7. The output of the laser interferometer 7 is supplied to the control system 13.

Thus, by effecting a scanning exposure operation while relatively moving each of the mask 4 and the wafer 5 with respect to the projection optical system 3 along x direction, the exposure apparatus transfers the pattern of the mask 4 onto an exposure area on the wafer 5. Then, by repeating the above-mentioned scanning exposure operation while successively driving the wafer 5 within xy plane in a two-dimensional manner, the apparatus successively transfers patterns of the mask 4 to the respective exposure areas of the wafer 5.

The projection exposure apparatus of FIG. 1 further comprises an alignment system for detecting the relative position of the wafer 5 and the mask 4 with respect to each other on the basis of a wafer mark WM (substrate mark) formed on the wafer 5 and a mask mark MM formed on the mask 4.

In the alignment system, a wafer mark detection system, which detects the wafer mark WM by using wafer mark detection light (first detection light) having a broad-band wavelength without the aid of the projection optical system 3, and a mask mark detection optical system, which emits mask mark detection light (second detection light), namely, alignment light, for detecting the mask mark MM, are realized by an alignment coaxial optical system 1.

Here, in this embodiment, in order to detect the mask mark MM, two-luminous-flux interference technique, namely, LIA (Laser Interferometric Alignment) technique, is used. In the two-luminous flux interference type alignment, two coherent luminous fluxes (laser beams, or the like) having wavelengths different from the wavelength of the exposure light irradiate the mask mark, which is formed as a diffraction grating, from predetermined two directions so as to form a one-dimensional interference fringe, which is then observed to specify the position of the mask mark MM.

Figure 2:
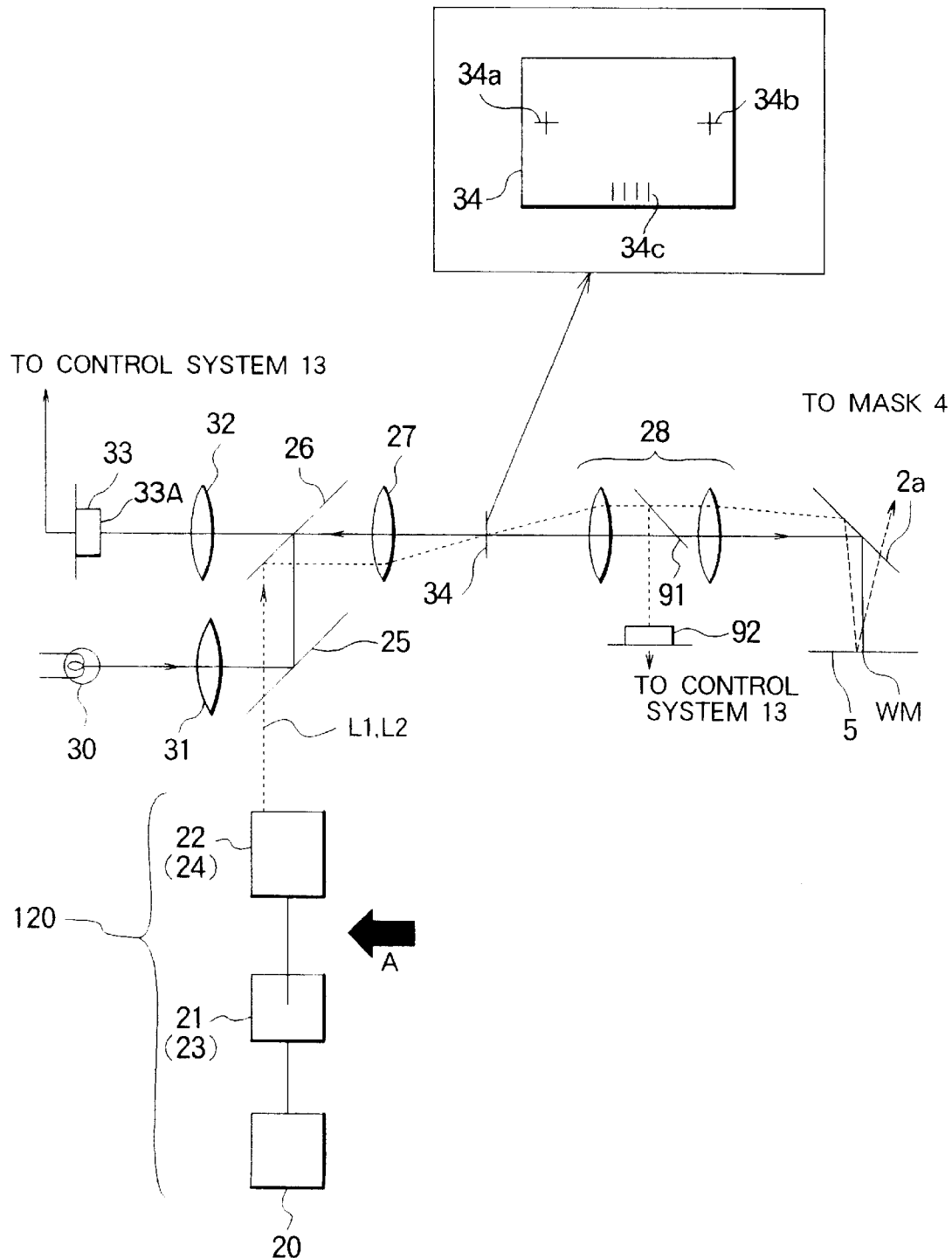
FIG. 2 is a view showing a configuration of an alignment coaxial optical system 1 in the exposure apparatus shown in FIG. 1.
Figure 3:
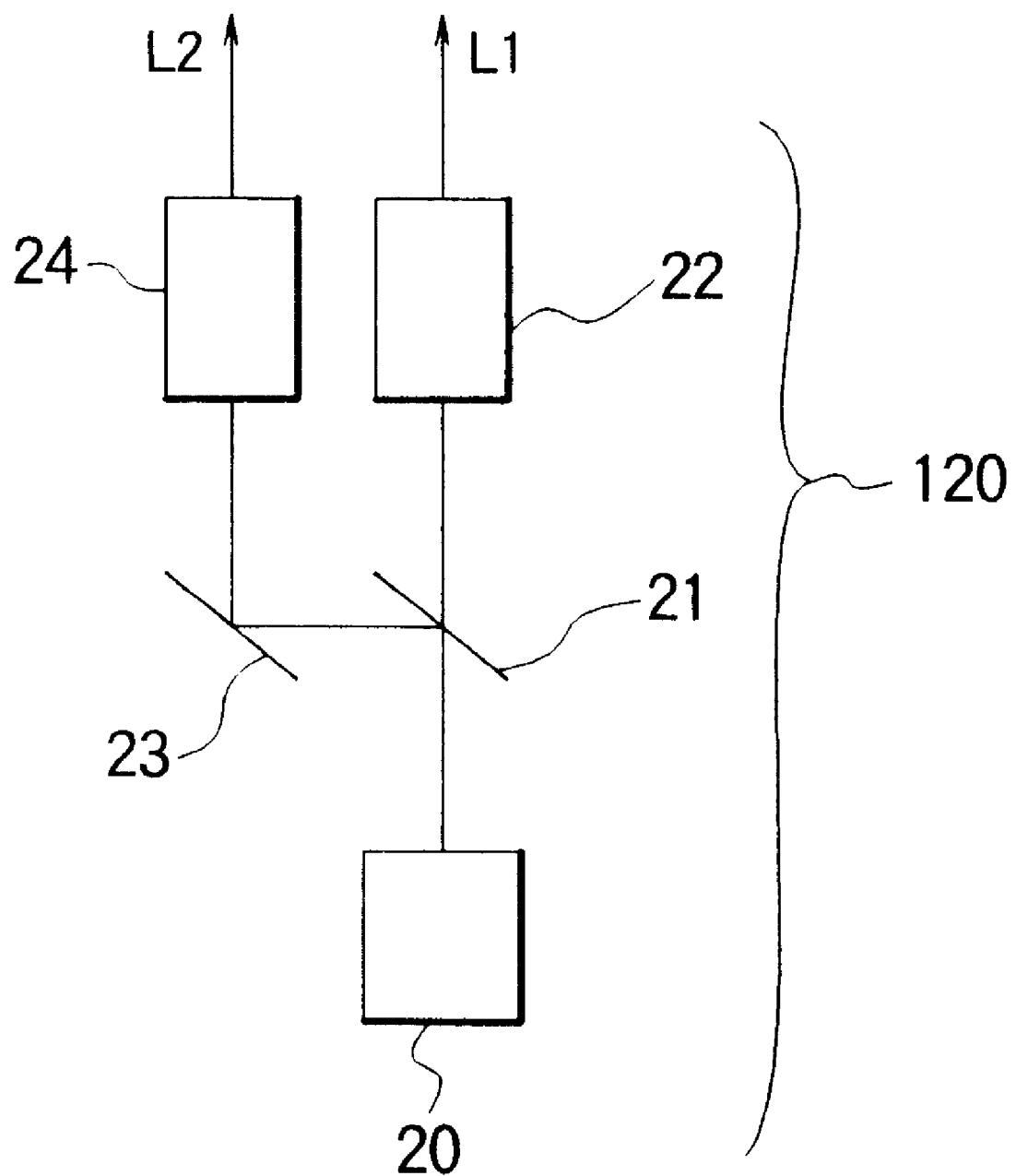
FIG. 3 is a view showing a configuration of a two-luminous-flux generating system 120 when the alignment coaxial optical system 1 is observed from a direction indicated by arrow A in FIG. 2.

FIGS. 2 and 3 are views schematically showing a configuration of the alignment coaxial optical system 1 in the embodiment of FIG. 1.

In FIGS. 2 and 3, the alignment coaxial optical system 1 comprises a laser light source 20 as a light source for supplying alignment light having a wavelength different from that of the exposure light. As the laser light source 20, an He—Ne laser which emits light having a wavelength of 633 nm can be used, for example. A laser beam emitted from the laser light source 20 is split into two beams by a half mirror 21. Here, FIG. 3 is a view showing a configuration of a two-luminous-flux generating system 120 in FIG. 2 observed from a direction indicated by arrow A in FIG. 1.

A beam L1 transmitted through the half mirror 21 enters a first acousto-optic device 22. On the other hand, a beam L2 reflected by the half mirror 21 enters a second acousto-optic device 24 by way of a half mirror 23.

Here, the first acousto-optic device 22 is driven by a high-frequency signal with a frequency f1, whereas the second acousto-optic device 24 is driven by a high-frequency signal with a frequency f2 (f2=f1−Δf). The upper limit of the frequency difference Δf is defined by the response of a detector 9 for detecting the mask mark which will be explained later.

Thus, the laser light source 20, the half mirror 21, the half mirror 23, the first acousto-optic device 22, and the second acousto-optic device 24 constitute the two-luminous-flux generating system 120 for generating the coherent light components L1 and L2.

As indicated by a short dashed line in FIG. 2, the beams L1 and L2 respectively transmitted through the first and second acousto-optic devices 22 and 24 are transmitted through a half mirror 25, reflected by a half mirror 26, and then guided to a condenser lens 27. After being converged by the condenser lens 27, a pair of the beams L1 and L2 are guided, by way of a relay lens system 28, to a reflective surface 2a of a deflecting member 2 provided in a light path between the projection optical system 3 and the wafer 5. The beams L1 and L2 reflected by the reflective surface 2a intersect on the wafer 5. Then, as will be explained later, a pair of the beams L1 and L2 totally reflected upon the wafer 5 are transmitted through an opening 2b of the reflective surface 2a so as to be guided to the projection optical system 3 and then, by way of the projection optical system 3, toward the mask 4.

Thus, the two-luminous-flux generating system 120, the half mirror 25, the half mirror 26, the condenser lens 27, the relay lens system 28, and the reflective surface 2a of the deflecting member 2 constitute a part of the mask mark detection optical system.

Also, the alignment coaxial optical system 1 comprises an illumination optical system 30 for supplying illumination light having a broad-band wavelength (e.g., 500 to 850 nm) as wafer mark detection light. The illumination light from the illumination light source is collimated by a collimator lens 31 and then guided to the half mirror 25. The illumination light reflected by the half mirror 25 is guided, by way of the half mirror 26, the condenser lens 27, and the relay lens system 28, to the reflective surface 2a of the deflecting member 2. The illumination light reflected by the reflective surface 2a downward illuminates the wafer mark WM formed on the wafer 5.

The reflected light from the wafer 5 generated by the downward illumination light is guided, by way of the reflective surface 2a, the relay lens system 28, and the condenser lens 27, to the half mirror 26. The light transmitted through the half mirror 26 forms, by way of an imaging lens 32, an image on an image pickup surface (light-receiving surface 33A) of an image pickup device 33 such as CCD. The output of the image pickup device 33 is supplied to the control system 13. Here, the half mirror 26 may be substituted by a polarizing beam splitter. As is well known, loss in light quantity decreases when a polarizing beam splitter and a ¼-wavelength plate are used in combination. Accordingly, this configuration may be used when light quantity is small.

Here, an index plate 34 is positioned at a wafer-side focal plane of the condenser lens 27. In the index plate 34, in addition to a pair of index marks 34a and 34b for observing the wafer mark, a grating-like reference mark 34c for detecting the mask mark is formed.

In this manner, based on the output of the image pickup device 33, the control system 13 can obtain image information constituted by the wafer mark WM and a pair of the index marks 34a and 34b. Also, as thus obtained image information is subjected to image processing, the position of the wafer mark WM can be detected.

Thus, the illumination light source 30, the collimator lens 31, the half mirror 25, the half mirror 26, the condenser lens 27, the relay lens 28, the reflective surface 2a, the index plate 34, the imaging lens 32, and the image pickup device 33 constitute a part of the wafer mark detection system for detecting the wafer mark.

Also, the mask mark detection system and the wafer mark detection optical system share the half mirror 25, the half mirror 26, the condenser lens 27, and the relay lens system 28. Accordingly, the mask mark detection system and the wafer mark detection optical system have so-called coaxial configuration.

As shown in FIG. 1, the deflecting member 2 is provided between the projection optical system 3 and the wafer stage 6 (or the wafer 5 set on the stage 6). A part 2A of this reflecting member 2 functions as a plane parallel plate with respect to the exposure light from the mask 4 transmitted through the projection optical system 3. Also, as mentioned above, a member 2B having the reflective surface 2a is unitedly formed with the deflecting member 2. By way of this reflective surface 2a, the wafer 5 is illuminated downward, while a pair of beams LR (L1 and L2) for detecting the mask mark MM are guided onto the wafer 5.

Figure 4:
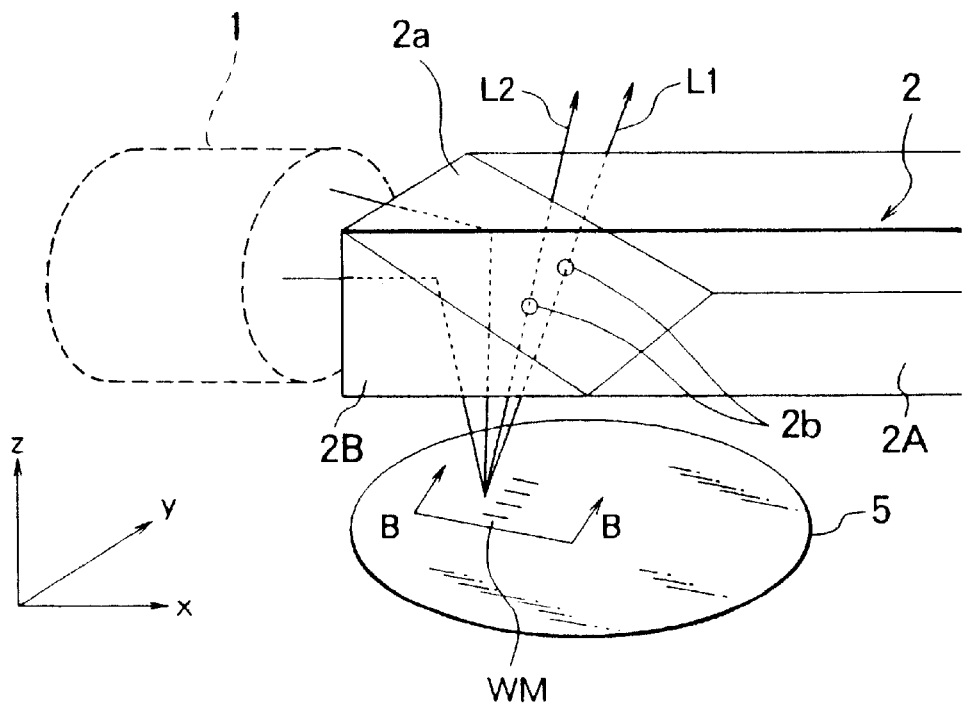
FIG. 4 is a view for explaining the configuration and operation of a deflecting member 2 shown in FIG. 1.

FIG. 4 is a view explaining the configuration and operation of the deflecting member 2 of FIG. 1.

As shown in FIG. 4, a pair of the beams LR (L1 and L2) totally reflected upon the wafer 5 are respectively transmitted through a pair of light-transmitting portions 2b formed as minute openings on the reflective surface 2a and then guided to the projection optical system 3. In this manner, as a pair of minute light-transmitting portions 2b are formed on the reflective surface 2a, the total reflection of the illumination light and alignment light in the reflective surface 2a and the total transmission of the alignment light reflected upon the substrate are realized.

Here, the reflective surface 2a may be formed by a semitransparent film which transmits a part of light therethrough while reflecting the rest of the light. In this case, however, since loss in light quantity occurs in each of the illumination light and alignment light, there is a possibility that accuracy in detection may deteriorate.

Figure 5:
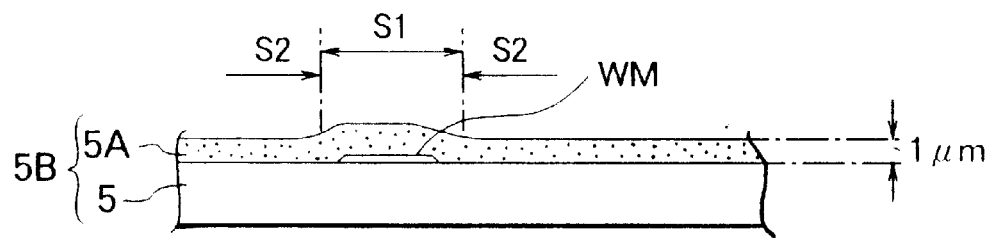
FIG. 5 is a view showing a cross-sectional configuration of a photosensitive substrate 5 along line B-B in FIG. 4.

FIG. 5 is a view showing a cross-sectional configuration of the wafer 5. In this drawing, a resist 5A is coated on the surface of the wafer 5 so as to form a photosensitive substrate 5B. Also, in this drawing, an area S1 indicates an area on the photosensitive substrate 5B to which the illumination light is guided, whereas an area S2 indicates a flat area on the photosensitive substrate 5B to which the alignment light is guided.

Figure 6:
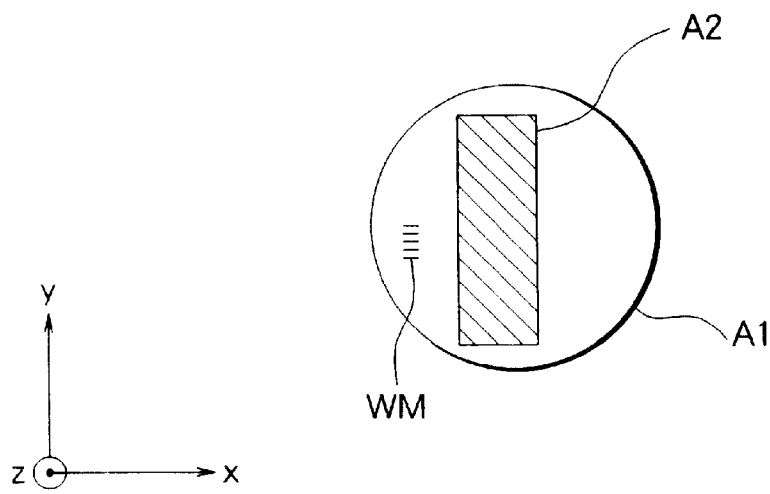
FIG. 6 is a view showing disposed positions of an effective field A1, an exposure area (illumination area of an illumination optical system) A2, and a substrate mark WM on a substrate.

FIG. 6 is a view showing arrangement of an effective field of the projection optical system, an exposure area, and the wafer mark WM on the wafer. As shown in FIG. 6, within an effective field A1 of the projection optical system 3 on the wafer 5, a rectangular exposure area A2 (indicated by hatched portion in the drawing) extending in y direction is formed. The wafer mark WM is formed within the effective field A1 at the left end in the drawing. Thus, the wafer mark WM is within the effective field A1, while being formed outside of the exposure area (i.e., illumination area by the illumination optical system 11).

Accordingly, the reflective surface 2a of the deflecting member 2 is positioned so as not to block the exposure light directed toward the exposure area A2 on the wafer 5 by way of the projection optical system 3.

With reference to FIG. 1 again, a pair of the beams LR incident on the projection optical system 3 enter a correction optical device (PGC) 8 disposed on a pupil surface P3 of the projection optical system 3. The correction optical system 8 is a transparent substrate having a diffraction grating at a predetermined position thereof, for example.

As mentioned above, a pair of the beams LR are made incident on the wafer 5 once and then guided to the mask 4 by way of the projection optical system 3. Accordingly, in order to prevent the resist 5A coated on the wafer 5 from sensing light, laser light having a wavelength of 600 nm or higher is used as a pair of the beams LR. On the other hand, since the aberration of the projection optical system 3 has been corrected with respect to excimer laser light (having a wavelength of 249 nm or 193 nm), a large chromatic aberration is generated with respect to a pair of the beams LR. Accordingly, the correction optical device 8 corrects axial chromatic aberration of the projection optical system 3 with respect to a pair of the beams LR transmitted therethrough.

Thus, by way of the correction optical device 8, a pair of the beams LR intersect (form an image) on the mask mark MM formed at a predetermined position on the mask 4.

Figure 7:
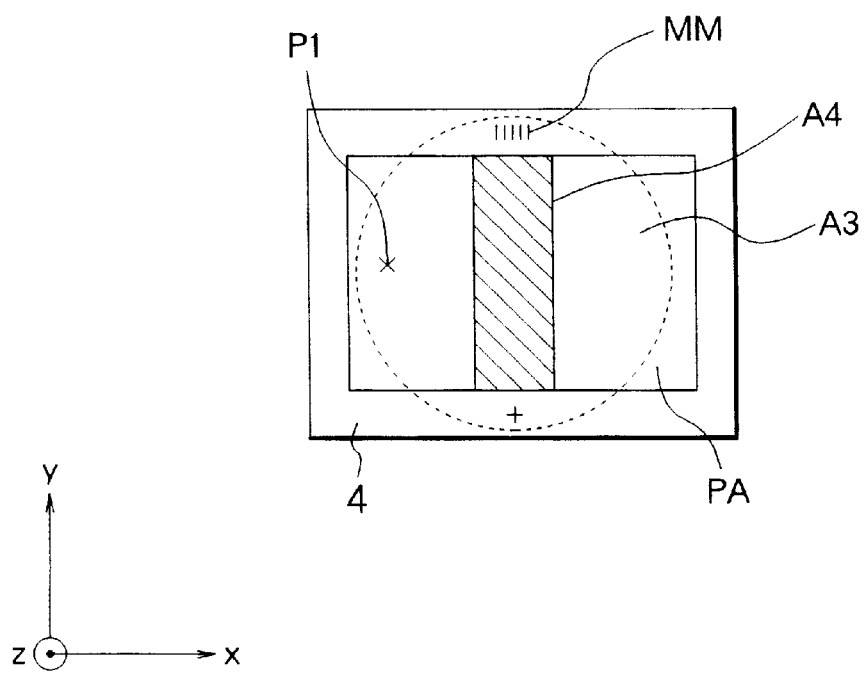
FIG. 7 is a view showing disposed positions of a pattern area PA, an effective field A3 of a projection optical system, a transfer target area A4 (illumination area of an illumination optical system), and a mask mark MM on a mask, in the exposure apparatus shown in FIG. 1.

FIG. 7 is a view showing arrangement of a pattern area, an effective field of the projection optical system, a transfer target area, and a mask mark on the mask 4 in the exposure apparatus shown in FIG. 1. As shown in FIG. 7, within an effective field A3 (indicated within a short-dashed circular line in the drawing) on the mask 4, a rectangular transfer target area A4 (indicated by a hatched portion in the drawing) extending in y direction is formed. The transfer target area A4 (i.e., illumination area by the illumination optical system 11) extends through a pattern area PA along y direction, while occupying a part of the pattern area PA along x direction. Accordingly, as the mask 4 is moved along x direction at the time of scanning exposure, the transfer target area A4 scans the whole pattern area PA.

Here, the conjugate position of a pair of the beams LR on the mask 4 is placed at a point P at the left end in the drawing within the transfer target area A4, namely, within the pattern area PA. Since the mask mark cannot be formed within the pattern area PA, however, the mask mark MM is formed at a position deviated from the pattern area PA along a direction, namely, y direction, perpendicular to the scanning direction (x direction) of the mask 4 in this embodiment. Here, as depicted, the mask mark MM is formed as a diffraction grating having a predetermined pitch along x direction (measurement direction or scanning direction), for example.

Accordingly, while correcting axial chromatic aberration with respect to a pair of the beams LR, the correction optical device 8 deflects (diffracts) a pair of the beams LR so as to make them intersect on the mask mark MM on the mask 4.

With reference to FIG. 1 again, a pair of the beams LR which have intersected on the mask mark MM are diffracted by the diffraction grating so as to generate two±first-order transmitted diffracted light components in the normal direction (z direction) of the mask 4. Thus generated two transmitted diffracted light components interfere with each other, thereby generating beat interference light LM.

The beat interference light LM from the mask mark MM is photoelectrically converted by the detector 9, thereby generating a mask mark signal. This mask mark signal is supplied to the control system 13 including a phase detection system.

On the other hand, as reference beams, a pair of beams other than the above-mentioned pair of the beams LR interfere with each other at the reference diffraction grating 34c of the index plate 34. Beat interference light generated by this interference is photoelectrically converted by a detector 92 by way of a luminous-flux separator 91 within the alignment coaxial optical system 1. A reference signal thus obtained by the detector 92 is also supplied to the control system 13 (see FIG. 2).

Thus, the control system 13 detects the phase difference of the mask mark signal from the phase of the reference signal. Then, based on thus detected phase difference, the position of the mask mark MM can be detected.

In this manner, the alignment system detects the relative position of the wafer 5 and the mask 4 with respect to each other, based on thus obtained information about the position of the wafer mark and information about the position of the mask mark.

As mentioned above, in this embodiment, illumination light having a broad-band wavelength is used to observe the wafer in order to detect the wafer mark WM. Accordingly, the influence of interference caused by the resist coated on the surface of the wafer 5 can be minimized, thereby enabling highly accurate detection of the wafer mark WM.

Also, in this embodiment, the wafer mark is detected near the outer periphery of the exposure area (illumination area) on the wafer 5, for example, within the effective field of the projection optical system. Accordingly, it is unnecessary to move the wafer in order to detect the wafer mark WM. Therefore, unlike the conventional off-axis technique, offset drift can be prevented from occurring, thereby improving accuracy in detection.

Further, in this embodiment, the optical system for detecting the wafer mark WM and the optical system for detecting the mask mark MM share a part thereof and have so-called coaxial configuration. Accordingly, the influence of fluctuation of optical axes in the respective detection optical systems is eliminated, thereby enabling stable detection free of drift and improving accuracy in detection.

Still further, in this embodiment, the deflecting member 2 is disposed between the projection optical system 3 and the wafer 5 such that a part thereof functions as a drop prism (member 2B having the reflective surface 2a) while the other part 2A functions as a plane parallel plate. As a result, the relative distance (base-line amount) of the wafer mark detection optical system and the projection optical system from each other is reduced, while the reflective surface 2a can be held stably. Also, since the mask mark detection beam is propagated through the deflecting member 2 disposed in a space between the projection optical system 3 and the wafer 5, the optical path length of this beam exposed to the atmosphere decreases in this space. Accordingly, this beam becomes hard to be influenced by fluctuation in the air, thereby improving accuracy in detection.

While the above-mentioned embodiment shows an example of a lens scan type projection exposure apparatus, it may be any of other typical projection exposure apparatuses.

Also, while the above-mentioned embodiment shows an example of the projection exposure apparatus using excimer laser light as exposure light, typical projection exposure apparatuses using other kinds of exposure light may be configured in a similar manner.

As explained in the foregoing, since the substrate mark (wafer mark) is detected by means of light having a broadband wavelength without the aid of the projection optical system, the influence of interference caused by the resist can be reduced in the present invention. Also, when it is configured such that the wafer mark is detected near the exposure area on the wafer, offset drift is prevented from occurring. Accordingly, in the projection exposure apparatus of the present invention, highly accurate alignment of the mask and the wafer with respect to each other can be effected.

Also, the wafer mark detection optical system and the mask mark detection optical system can have so-called coaxial configuration. In this case, the influence of fluctuation of the optical axis in each detection optical system can be eliminated, thereby enabling stable alignment free of drift. Therefore, accuracy in detection can be further improved.

Figure 8:
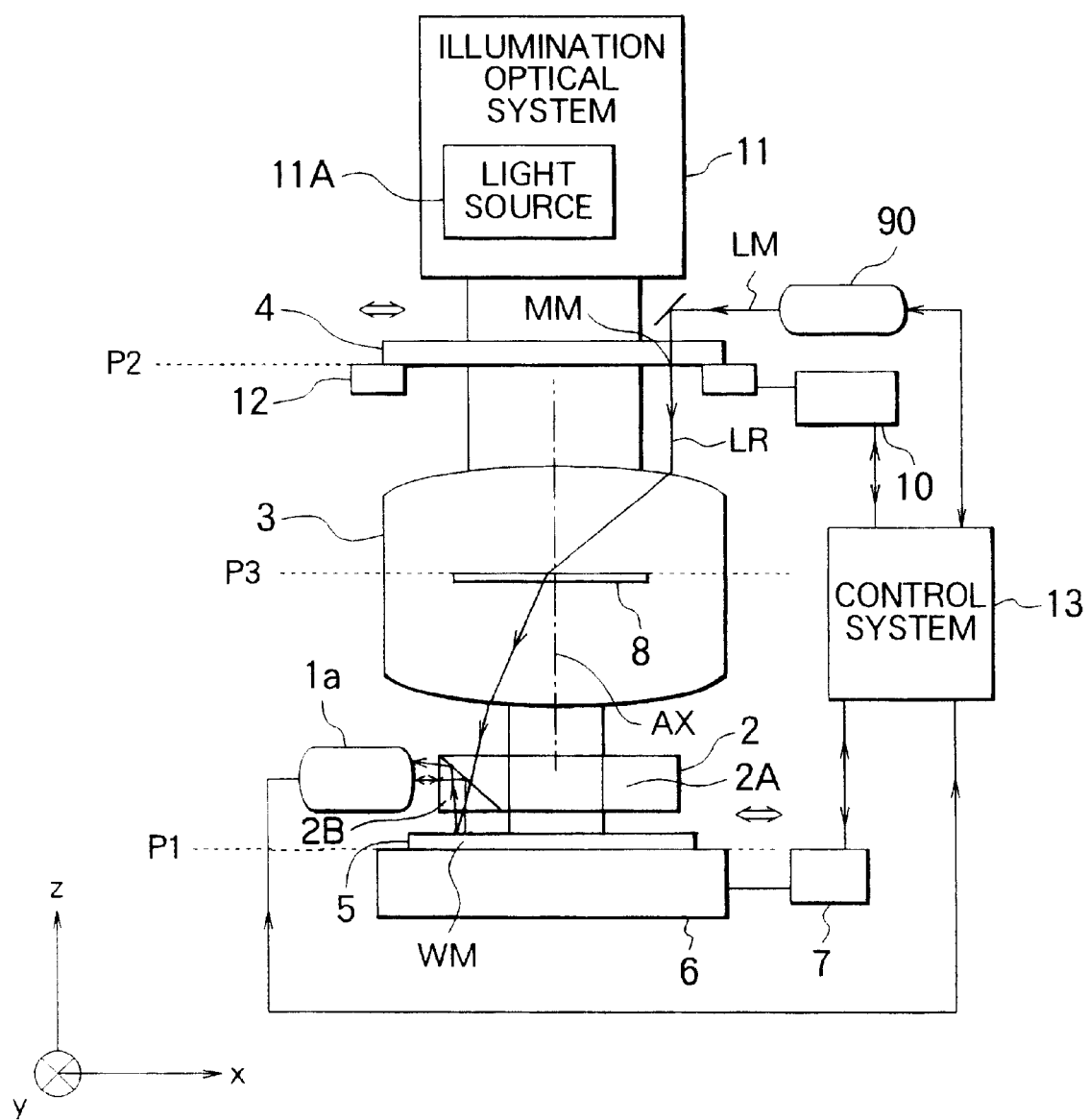
FIG. 8 is a view showing a configuration of an applied example of the first embodiment of the exposure apparatus according to the present invention shown in FIG. 1.

Next, FIG. 8 is a view showing a configuration of an applied example of the first embodiment of the exposure apparatus shown in FIG. 1.

In this embodiment, a mask second mark detection optical system has a different structure as compared with the mark mark detectrion optical system of FIG. 1. Namely, a light source system 90 included in this mask mark detection optical system is positioned near the mask stage 12, instead of the detector 9. The light source system 90 is a two-liminous-flux generating system having a structure shown in FIG. 3. On the other hand, a optical system 1a defined as a part of a wafer mark detection optical system has the same structure as the optical system shown in FIG. 2 excluding the two-luminous-flux generating system 120. Therefore, the image pickup device 33 is included in both the mask mark detection optical system and the wafer mark detection optical system in the alignment system of FIG. 8.

Figure 9:
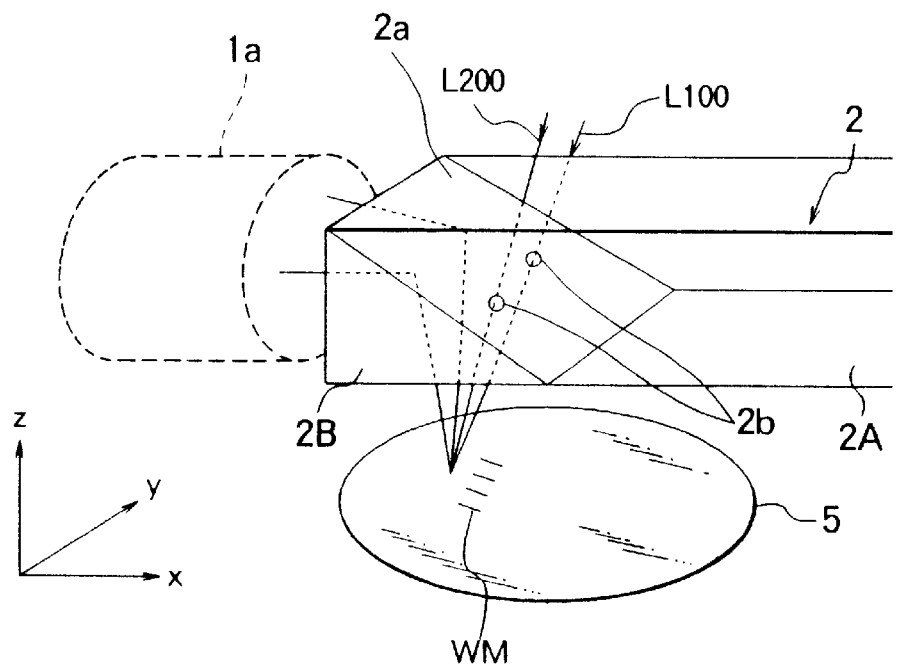
FIG. 9 is a view for explaining the configuration and operation of a deflecting member 2 shown in FIG. 8.

FIG. 9 shows a light path that an alignment light (a pair of beams L100 and L200) from the light source system 90 travels. In this structure, the alignment light that passes through the mask 4 and the projection optical system 3 in order reaches the wafer 5 through the opening 2b of the reflective surface 2a in the deflecting member 2. Further, the reflected alignment light from the surface of the wafer 5 is reflected by the reflective surface 2a in the deflecting member 2 and are guided to the optical system 1a.

Figure 10:
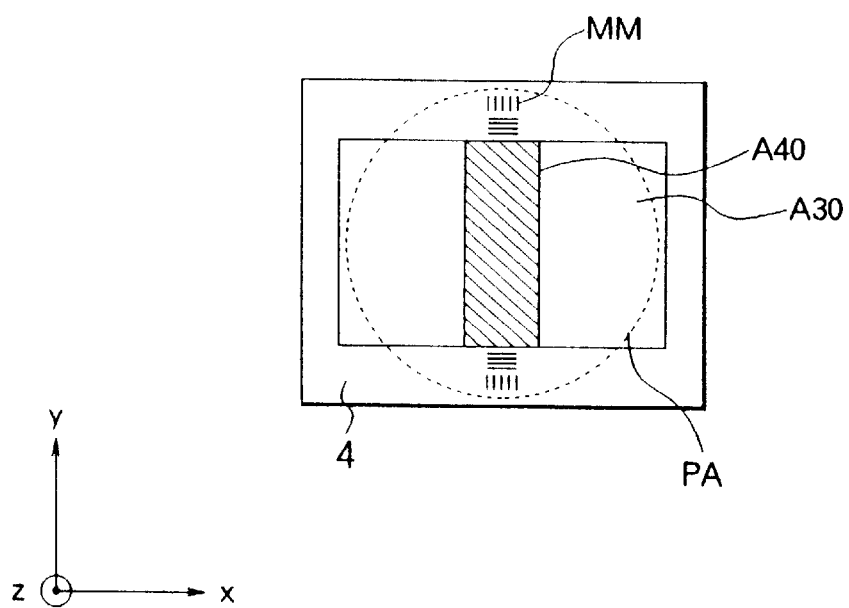
FIG. 10 is a view showing disposed positions of a pattern area PA, an effective field A30 of a projection optical system, a transfer target area A40 (illumination area of an illumination optical system), and a mask mark MM on a mask, in the exposure apparatus shown in FIG. 8.

As described above, in the embodiment of FIG. 8, the light source system 90 of mask mark detectin optical system illuminates the mask mark MM on the mask 4. Here, as depicted in FIG. 10, the mask marks MM are formed as a diffraction grating having a predetermined pitch along x direction (measurement direction or scanning direction) and y direction perpendicular to x direction, for example. A pair of beams L100 and L200 from the light source system 90 are corrected by the correction element 8 and thereafter cross each other at the surface of the wafer 5. The beams that reach the wafer 5 respectively are reflected at the surface of the wafer 5 and are guided to the optical system 1a, as shown in FIG. 9. Since the beams from the light source system 90 come into focus at the surface of the wafer 5, the surface of the wafer 5 becomes to be conjugate with the light-receiving surface 33A of the image pickup device 33 with respect to the beams and can be observed by the image pickup device 33 together the wafer mark WM. Therefore, The alignment system shown in FIG. 8 can perform a highly accurate alignment because the mask mark MM and the wafer mark WM can be observed in a common detection field of the image pickup device 33. In particular, in the embodiment, since the heterodyne optical system as shown in FIG. 2 is not necessary, a structure of each of the mask mark detection optical system and the wafer mark detection optical system can be simple.

Further, FIG. 10 is a view showing arrangement of a pattern area, an effective field of the projection optical system, a transfer target area, and a mask mark on the mask 4 in the exposure apparatus shown in FIG. 8. As shown in FIG. 10, within an effective field A30 (indicated within a short-dashed circular line in the drawing) on the mask 4, a rectangular transfer target area A40 (indicated by a hatched portion in the drawing) extending in y direction is formed. The transfer target area A40 (i.e., illumination area by the illumination optical system 11) extends through a pattern area PA along y direction, while occupying a part of the pattern area PA along x direction. Accordingly, as the mask 4 is moved along x direction at the time of scanning exposure, the transfer target area A40 scans the whole pattern area PA.

Since the mask mark cannot be formed within the pattern area PA, however, the mask marks MM are formed at positions deviated from the pattern area PA along predetermined directions, namely, x direction and y direction perpendicular to the scanning direction (x direction) of the mask 4 in this embodiment.

In the following, the second embodiment of the exposure apparatus according to the present invention will be explained.

In general, in the projection exposure apparatus in which exposure is effected with excimer laser light (having such a wavelength as 193 nm or 248 nm) such as that mentioned above, the aberration of the projection optical system has been favorably corrected with respect to the excimer laser light which is exposure light. Here, in order to prevent the resist coated on the wafer from sensing light, it is necessary to use red light (having a wavelength of 600 to 800 nm), for example, as alignment light. In this case, large chromatic aberration (axial chromatic aberration, chromatic aberration in magnification, or the like) is generated in the projection optical system with respect to the alignment light.

When a large chromatic aberration is generated in the projection optical system with respect to the alignment light as in the case mentioned above, it is difficult to detect the wafer position by way of the projection optical system according to TTR technique. Accordingly, in the projection exposure apparatus using exposure light having a short wavelength in particular, off-axis technique, in which the wafer position is detected by way of a wafer observation system other than the projection optical system, has been used.

In the wafer observation system, the position of the wafer mark is detected by the reference index disposed within the wafer observation system and the wafer mark image. On the other hand, the position of the wafer stage is measured by a laser interferometer using a movable reflector disposed at the wafer stage and a stationary reflector disposed in the projection optical system. Then, based on the position of the wafer mark detected by the wafer observation system and the position of the wafer stage measured by the laser interferometer, the position of the wafer is detected.

Here, during exposure, the present position of the wafer is detected on the basis of the position (i.e., moving amount) of the wafer stage measured by the laser interferometer and the initial position of the wafer.

As mentioned above, the laser interferometer detects the position of the wafer stage by using, as a reference element, the stationary reflector disposed at the projection optical system with respect to the movable reflector disposed at the wafer stage. On the other hand, the wafer observation system detects the position of the wafer mark by using, as a reference element, the reference index formed within the wafer observation system with respect to the wafer mark formed on the wafer. Here, the wafer observation system is attached to a tube supporting the projection optical system.

Accordingly, when an optical system such as a mirror fluctuates due to changes in environment such as temperature, vibration, or the like, the relative position of the stationary reflector, which is a reference element for the laser interferometer, and the reference index, which is the reference element for the wafer observation system, with respect to each other may change. As a result, so-called offset drift may occur between the laser interferometer and the wafer observation system, thereby lowering the accuracy in detecting the position of the wafer.

The exposure apparatus of the second embodiment comprises a special alignment system applicable to the situation mentioned above.

Figure 11:
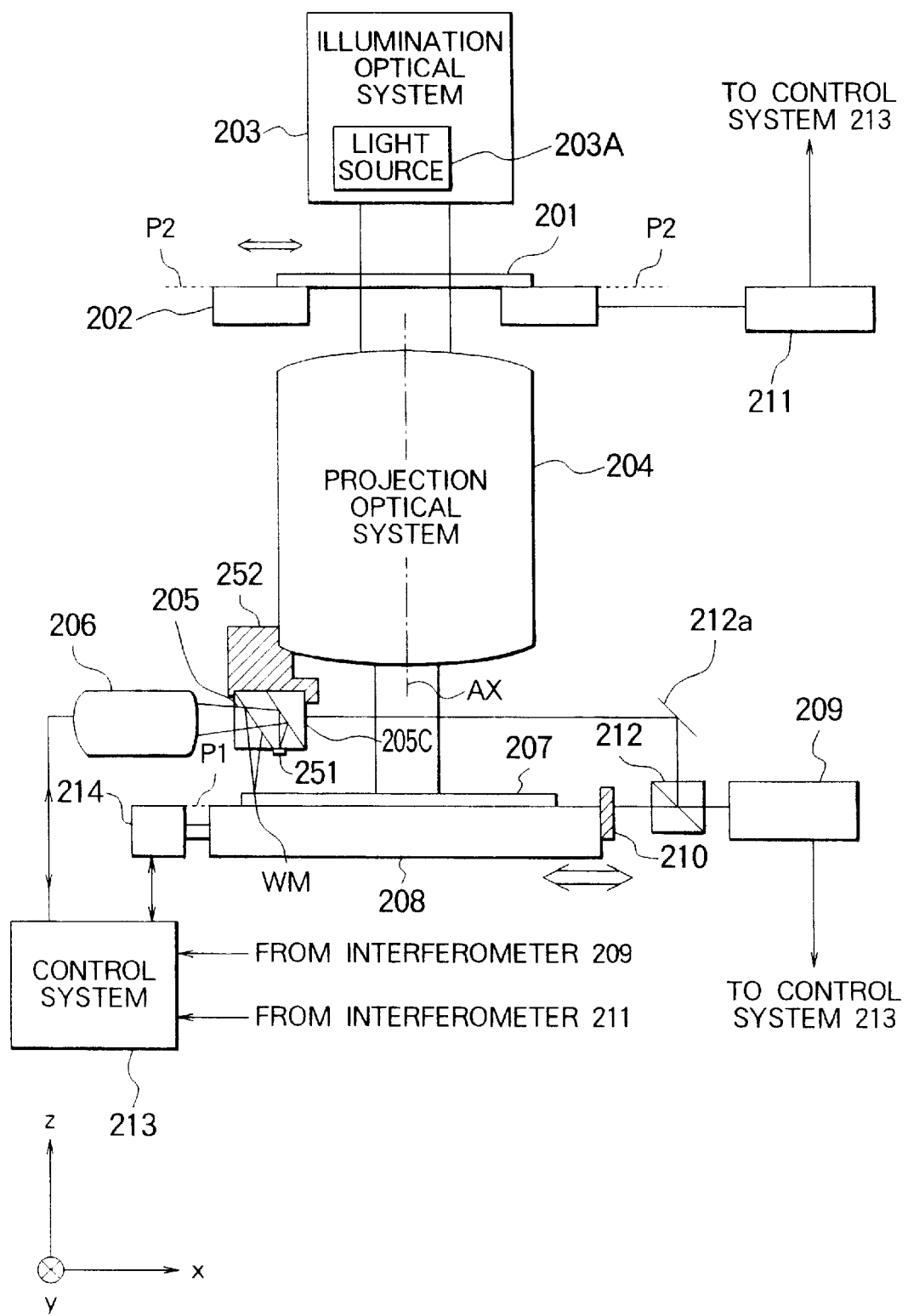
FIG. 11 is a view showing a configuration of a second embodiment of the exposure apparatus according to the present invention.

FIG. 11 is a view schematically showing a configuration of the second embodiment of the exposure apparatus according to the present invention. The embodiment shown in FIG. 11 relates to so-called lens scan type scanning projection exposure apparatus in which exposure is effected while each of a mask and a wafer is relatively moved with respect to a projection optical system.

In FIG. 11, z axis is set in parallel to an optical axis AX of a projection optical system 204; x axis is set in parallel to the paper surface of FIG. 11 within a plane perpendicular to the optical axis AX; and y axis is set to a direction perpendicular to z axis and x axis.

The projection exposure apparatus of FIG. 11 comprises an illumination optical system 203 for uniformly illuminating a mask 201 with exposure light such as excimer laser light (with a wavelength of 249 nm or 193 nm) derived from KrF or ArF. This illumination optical system 203 includes a light source 203A. The mask 201 is supported on a mask stage 202. The mask stage 202 is movable in x direction and y direction within xy plane which is perpendicular to the optical axis AX of the projection optical system 204. The x-direction moving amount and y-direction moving amount of the mask stage 202 are always measured by a laser interferometer 211 for detecting the position of the mask stage 202. The output of the laser interferometer 211 is supplied to a control system 213.

Light transmitted through the mask 201, in which a circuit pattern, for example, has been formed, reaches a wafer 207, which is a photosensitive substrate, by way of the projection optical system 204, whereby a pattern image of the mask 201 is formed on the wafer 207.

Here, the wafer 207 is supported on a wafer stage 208 by way of a wafer holder. By a driving system 214, the wafer stage 208 can be two-dimensionally driven within xy plane which is perpendicular to the optical axis AX of the projection optical system 204. The x-direction moving amount and y-direction moving amount of the wafer stage 208 are always measured by a laser interferometer 209 for detecting the position of the wafer stage 208. The output of the laser interferometer 209 is supplied to the control system 213.

Thus, by effecting a scanning exposure operation while relatively moving each of the mask 201 and the wafer 207 with respect to the projection optical system 204 along x direction (scanning direction), the exposure apparatus transfers the pattern of the mask 201 onto an exposure area on the wafer 207. Then, by repeating the above-mentioned scanning exposure operation while successively driving the wafer 207 within xy plane in a two-dimensional manner, the apparatus successively transfers patterns of the mask 201 to the respective exposure areas of the wafer 207.

As mentioned above, the projection exposure apparatus of FIG. 11 comprises the laser interferometer 209 as a main body of a wafer stage position detection system for detecting the position of the wafer stage 208. A beam emitted from the laser interferometer 209 is split into two by a beam splitter 212. Namely, the light transmitted through the beam splitter 212 becomes a measurement beam and is made incident on a movable reflector 210 fixed to the wafer stage 208. On the other hand, the light reflected by the beam splitter 212 becomes a reference beam and is made incident, by way of a mirror 212a, on a stationary reflector (reflective surface indicated by 205c in FIG. 13 explained later) formed at a holding member 205 which is an optical member fixed to the projection optical system 204 on the wafer side. This holding member 205 is fixed to a predetermined position of the projection optical system 204 by way of a supporting member 252.

The return light from the movable reflector 210 and the return light from the stationary reflector 205c are combined together by the beam splitter 212, and thus formed composite light enters the laser interferometer 209. Based on the interference of the reference beam and the measurement beam in the composite light with each other, the laser interferometer 209 detects the moving amount of the wafer stage 208 and, accordingly, the position of the wafer stage 208.

The projection exposure apparatus of FIG. 11 further comprises a main body 206 of a wafer mark position detection system for detecting the position of a wafer mark WM formed on the wafer 207.

Figure 12:
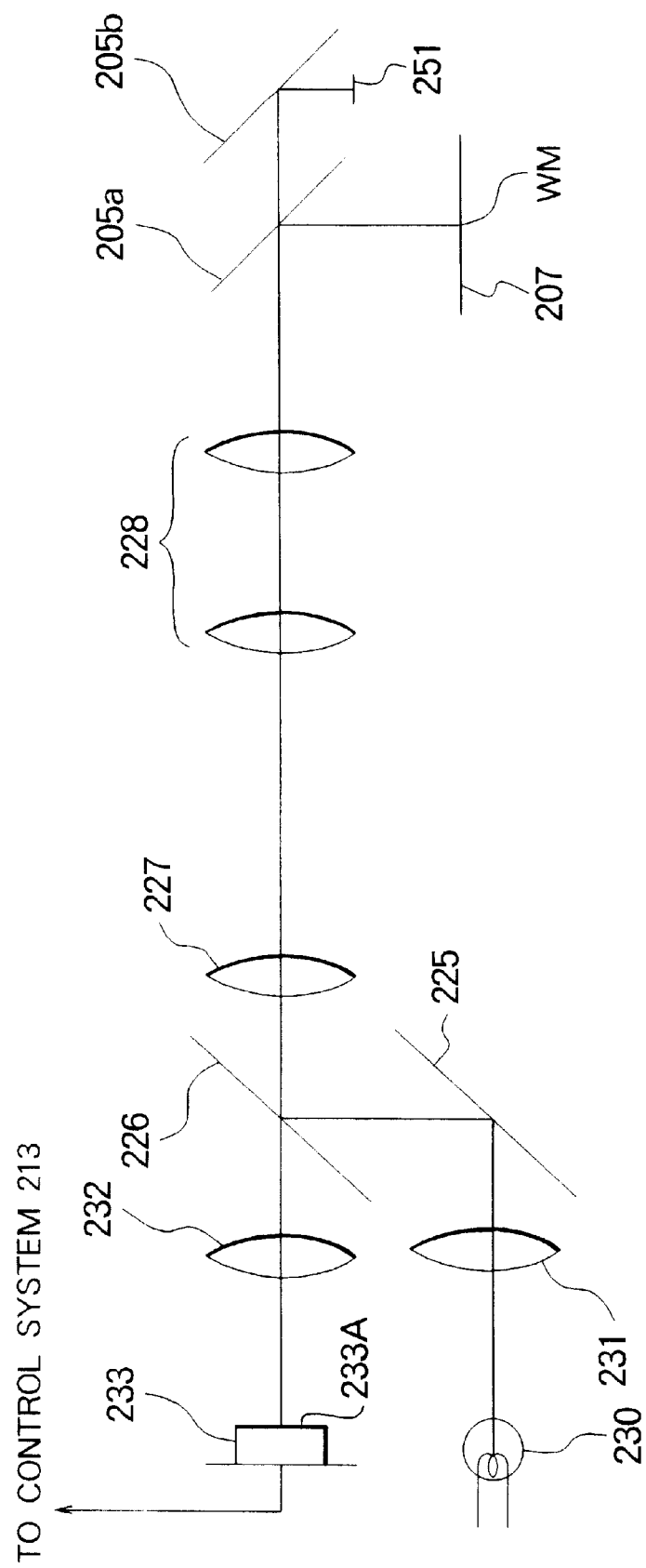
FIG. 12 is a view showing an internal configuration of a substrate mark position detection system 206 shown in FIG. 11.
Figure 13:
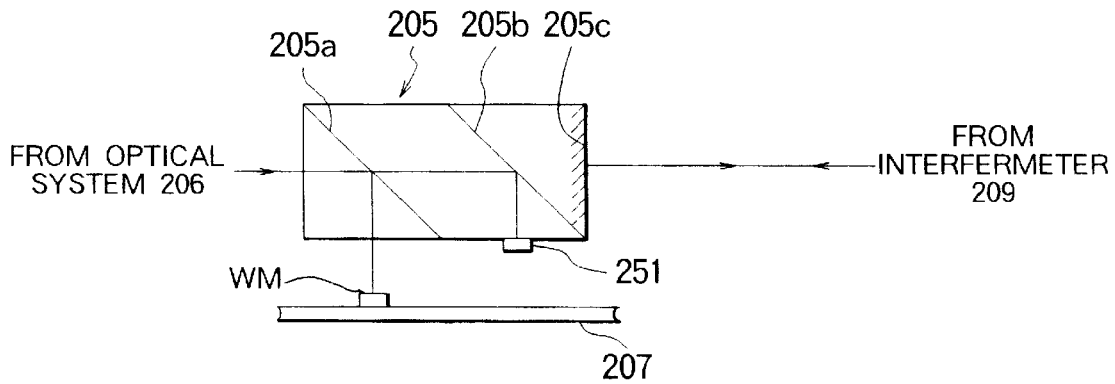
FIG. 13 is a view showing a configuration of a holding member 205 shown in FIG. 11.

FIG. 12 is a view schematically showing an internal configuration of the main body 206 of the wafer mark position detection system in FIG. 11. Also, FIG. 13 is a view schematically showing a configuration of the holding member 205 of FIG. 11.

In FIG. 12, the wafer mark position detection system 206 comprises a light source 230 for supplying illumination light having a broad-band wavelength (e.g., 500 to 850 nm). The illumination light from the light source 230 is turned into a parallel luminous flux by a collimator lens 231 and then guided to a half mirror 225. The illumination light reflected by the half mirror 225 is guided, by way of a half mirror 226, a condenser lens 227, and a relay lens system 228, to a polarizing surface (or semitransparent surface) 205a of the holding member 205. The illumination light reflected by the polarizing surface 205a illuminates the wafer mark WM formed on the wafer 207.

On the other hand, the illumination light transmitted through the polarizing surface 205a is reflected by a reflective surface 205b so as to illuminate a reference index 251 formed on the lower surface of the holding member 205. Here, the reference index 251 is formed at a position which is substantially optically conjugate with the wafer mark WM.

The reflected light from the wafer mark WM with respect to the illumination light and the reflected light from the reference index 251 with respect to the illumination light are combined together by the polarizing surface 205a and guided, by way of the relay lens system 228 and the condenser lens 227, to the half mirror 226. The light transmitted through the half mirror 226 forms, by way of an imaging lens 232, an image on an image pickup surface of an image pickup device 233 such as CCD.

Figure 14:
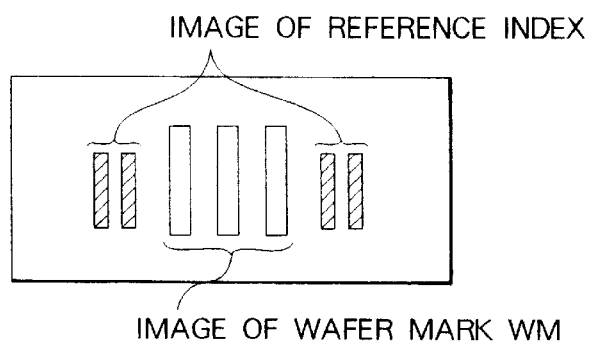
FIG. 14 is a view showing an image of the substrate mark WM and an image of a reference index 251 formed on an image pickup surface (light-receiving surface 233A) of an image pickup device 233 shown in FIG. 11.

Thus, as shown in FIG. 14, the image of the wafer mark WM and the image of the reference index 251 are formed on the image pickup surface (light-receiving surface 233A) of the image pickup device 233. The output of the image pickup device 233 is supplied to the control system 213. In the control system 213, on the basis of the output of the image pickup device 233, image information composed of the image of the wafer mark WM and the image of the reference index 251 is subjected to image processing, whereby the position of the wafer mark WM is detected.

In this manner, the light source 230, the collimator lens 231, the half mirror 225, the half mirror 226, the condenser lens 227, the relay lens system 228, the holding member 205, the imaging lens 232, and the image pickup device 233 constitute the wafer mark position detection optical system for detecting the position of the wafer mark WM.

Thus, in this embodiment, the stationary reflector 205c, which is a reference element in the wafer stage position detection system for detecting the position of the wafer stage 208, is disposed at the holding member 205 which is fixed to the projection optical system 204 by way of the supporting member 252. Also, the reference index 251, which is the reference element in the wafer mark position detection system for detecting the position of the wafer mark WM, is disposed on a surface of the same holding member 205.

Accordingly, no substantial relative displacement occurs between the two reference elements. As a result, no offset drift occurs between the wafer mark detection system and the wafer stage position detection system, thereby enabling highly accurate detection of the position of the wafer. Also, since light having a relatively broad wavelength width is used for detecting the wafer mark, the influence of interference by the resist can be reduced in this embodiment.

Figure 15:
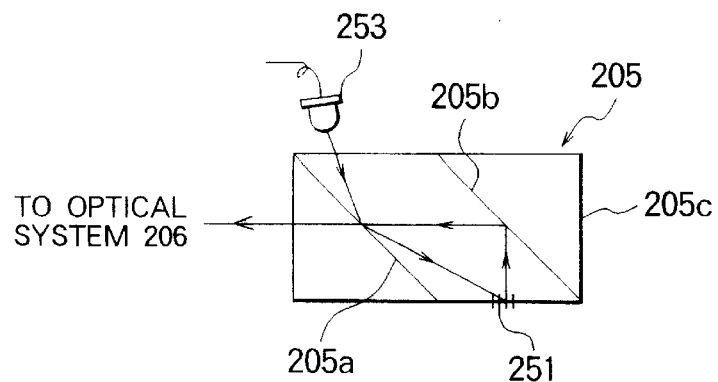
FIG. 15 is a view showing a configuration of an applied example of the holding member 205, wherein the reference index 251 is obliquely illuminated.

FIG. 15 is a view showing a modified example in which the reference index 251 formed at the holding member 205 is obliquely illuminated.

In the modified example shown in FIG. 15, the reference index 251 is constituted by a diffraction grating having a fine pitch. Also, illumination light from an illumination system 253 for the reference index is guided to the polarizing surface (or semitransparent surface) 205a of the holding member 205 as indicated by arrow in the drawing so as to obliquely illuminate the diffraction grating 251. The diffracted light from the diffraction grating 251 with respect to the illumination light is reflected by the reflective surface 205b and then transmitted through the polarizing surface 205a so as to be guided to the wafer mark detection system 206 as indicated by arrow in the drawing. In this manner, based on the diffracted light from the diffraction grating 251, a bright field image of the diffraction grating (reference index) 251 is formed on the image pickup surface 233A of the image pickup device 233.

Figure 16:
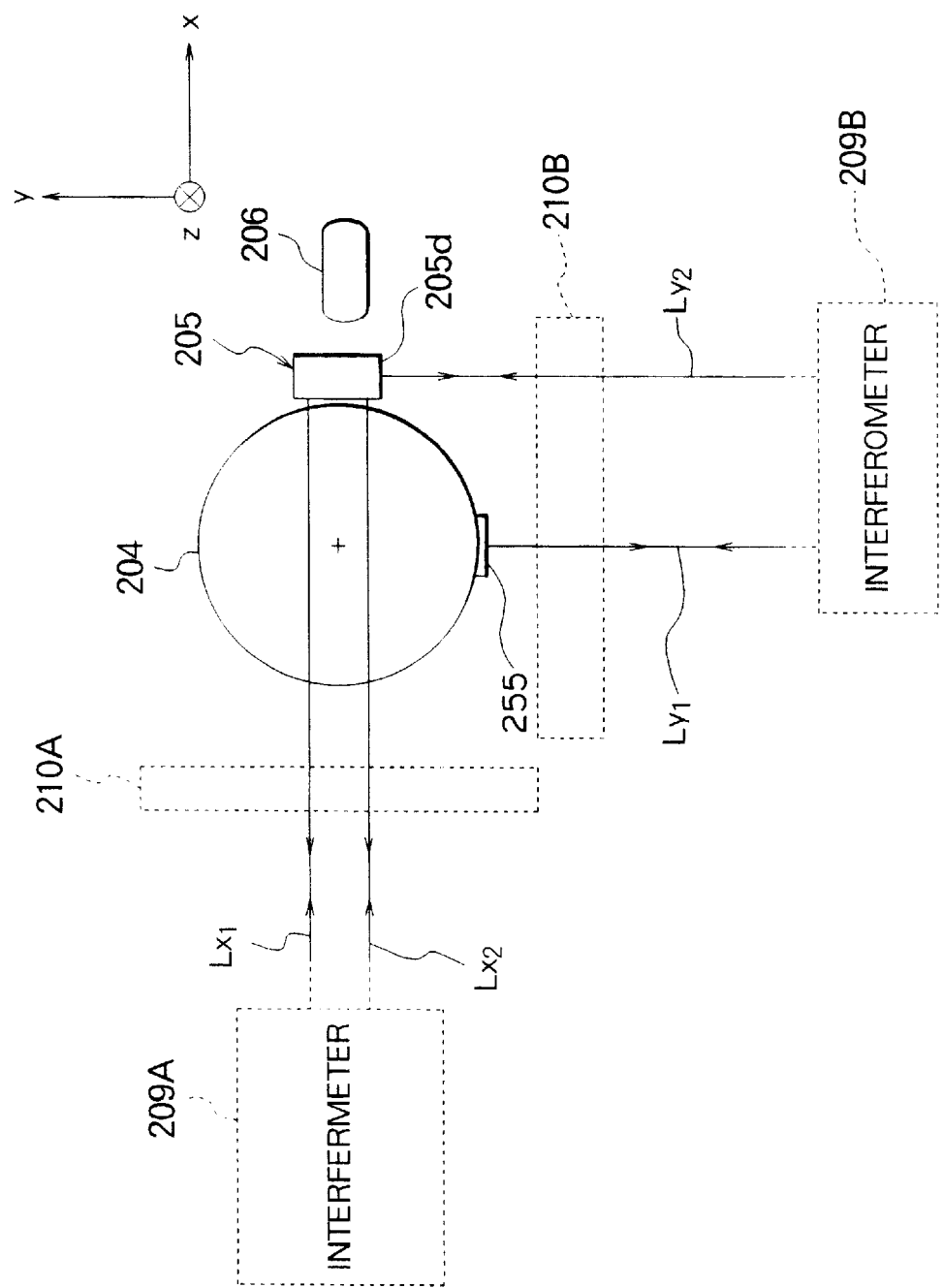
FIG. 16 is a view showing a configuration of a laser interferometer for detecting displacement of a substrate stage in an exposure apparatus according to the present invention, wherein the laser interferometer is constituted by a laser interferometer for detecting stage displacement in X direction and a laser interferometer for detecting stage displacement in Y direction.

FIG. 16 is a view schematically showing configurations of x-direction interferometer and y-direction interferometer in the laser interferometer 209 for detecting the position of the wafer stage 208. Also, its detailed configuration is disclosed in U.S. Pat. No. 4,780,617. The laser interferometer 209 has an x-direction interferometer 209A for measuring the x-direction moving amount of the wafer stage 208 and a y-direction interferometer 209B for measuring the y-direction moving amount of the wafer stage 208 which are independent from each other.

In the x-direction interferometer 209A included in the laser interferometer 209, an x-direction first reference beam $Lx_1$ and an x-direction second reference beam $Lx_2$ are respectively made incident on two points which are separated from each other in y direction on the reflective surface 205c of the holding member 205. Also, on the wafer stage 208, an x-direction movable reflector 210A having a reflective surface in parallel to yz plane is disposed, while an x-direction first measurement beam and an x-direction second measurement beam (none of them being depicted) are respectively made incident on two points which are separated from each other in y direction on the reflective surface of the movable reflector 210A. Thus, based on interference light generated by the x-direction first reference beam and the x-direction first measurement beam and interference light generated by the x-direction second reference beam and the x-direction second measurement beam, the x-direction moving amount of the wafer stage 208 and the rotating amount thereof around z axis are detected.

In the y-direction interferometer 209B included in the laser interferometer 209, on the other hand, a y-direction first reference beam $Ly_1$ is made incident on a reflective surface, which is in parallel to xz plane, of a stationary reflector 255 attached to the projection optical system 204. Also, a y-direction second reference beam $Ly_2$ is made incident on a reflective surface 205d which is formed in the holding member 205 so as to be in parallel to xz plane. Further, on the wafer stage 208, a y-direction movable reflector 210B having a reflective surface in parallel to xz plane is disposed, while a y-direction first measurement beam and a y-direction second measurement beam (none of them being depicted) are respectively made incident on two points which are separated from each other in x-direction on the reflective surface of the movable reflector 210B. Thus, based on interference light generated by the y-direction first reference beam and the y-direction first measurement beam and interference light generated by the y-direction second reference beam and the y-direction second measurement beam, the y-direction moving amount of the wafer stage 208 and the rotating amount thereof around z axis are detected.

While the above-mentioned embodiment shows an example in which the present invention is applied to the wafer mark position detection system and the wafer stage mark position detection system, it is clear that the present invention is also applicable to the mask mark position detection system and the mask stage position detection system in a scanning type projection exposure apparatus. In the mask mark position detection system, however, since there is no influence of interference by the resist, it is unnecessary to use light with a broad wavelength width.

Also, while the above-mentioned embodiment shows an example in which the wafer observation system and the laser interferometer are respectively used as a wafer mark position detection system and a wafer stage position detection system, the present invention is applicable to other appropriate detection systems using a reference element.

Further, while the above-mentioned embodiment shows an example of a lens scan type scanning projection exposure apparatus, it may be any of the other typical projection exposure apparatuses.

Also, while the above-mentioned embodiment shows a projection exposure apparatus in which excimer laser light is used as exposure light, typical projection exposure apparatuses using other kinds of exposure light may be configured in a similar manner.

The above-mentioned embodiment of the present invention shows an example in which an optical member (holding member) is constituted by a prism assembly. However, without being restricted thereto, in the case where the wafer mark position detection system 206 is disposed in parallel to the projection optical system 204 such that their respective optical axes are in parallel to each other, for example as shown in FIG. 17, a plane parallel plate 265 may be fixedly disposed between the wafer mark position detection system 206 and the wafer 207 (e.g., fixed to the projection optical system 204 by way of a supporting member 266) so as to function as an optical member (holding member).

In this case, in the plane parallel plate 265, the reference index 251, a reflective surface 265c, and a semitransparent surface (or dichroic mirror surface) 265a as a light-splitting surface are formed on its upper surface, side surface, and lower surface, respectively. Also, the reference index 251 is formed at a position which is conjugate with the wafer mark WM on the wafer surface.

Figure 17:
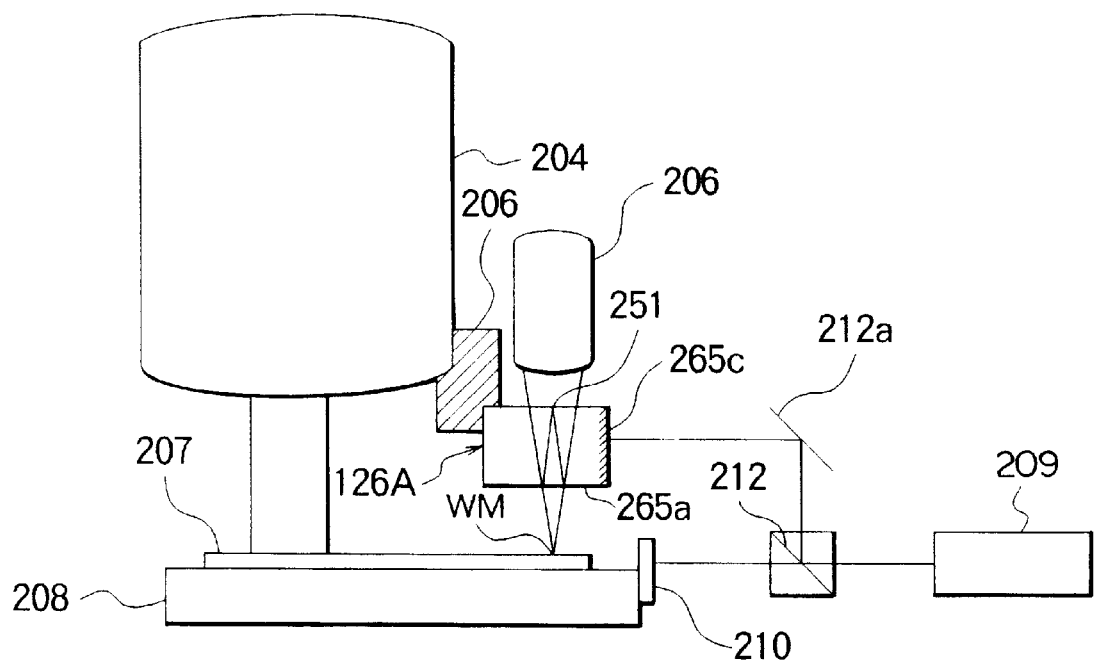
FIG. 17 is a view showing a configuration of an applied example of the second embodiment of the exposure apparatus according to the present invention shown in FIG. 11.

According to the foregoing configuration of FIG. 17, the illumination light from the wafer mark position detection system 206 is split into reflected light and transmitted light by means of the semitransparent surface (or dichroic mirror surface) 265a on the lower surface of the plane parallel plate 265. The reflected light illuminates the reference index 251, while the transmitted light illuminates the wafer mark WM. Then, the wafer mark position detection system 206 receives the reflected light components from the respective indexes (251 and WM) by way of the lower surface 265a and upper surface of the plane parallel plate 265, respectively, thereby detecting the position of the wafer mark WM.

On the other hand, the reflective surface 265c formed on the side surface of the plane parallel plate functions as the reference stationary reflector of the laser interferometer 209. Thus, the laser interferometer 209 receives the laser beams which have been split by the beam splitter 212 so as to be respectively guided to the reflective surface 205c and the movable reflector 210 fixed to an end of the wafer stage 208, thereby detecting the position of the wafer stage 208.

As explained in the foregoing, in the present invention, the reference index of the substrate mark position detection system (wafer mark position detection system) and the reference index of the substrate stage position detection system (wafer stage position detection system) are unitedly held. Accordingly, no offset drift occurs between the substrate stage position detection system and the substrate mark position detection system, whereby the position of the substrate can be detected with a high accuracy.

In the following, the third embodiment of the exposure apparatus according to the present invention will be explained.

In the conventional projection exposure apparatus, in general, a first stationary reflector, which is a reference element of the laser interferometer for the mask stage, is fixed to a frame which holds the projection optical system, while a second stationary reflector, which is a reference element of the laser interferometer for the wafer stage, is fixed to the tube of the projection optical system.

Accordingly, when the projection optical system vibrates with respect to the frame due to movement of the mask stage and wafer stage during scanning exposure, the relative position of the first and second stationary reflectors with respect to each other may change. Also, due to changes in environment such as temperature, the relative position of the two stationary reflectors with respect to each other may change. As a result, the accuracy in the laser interferometer for the mask stage may deteriorate. Also, so-called offset drift may occur between the laser interferometer for the mask stage and the laser interferometer for the wafer stage, thereby lowering the accuracy in positioning of the mask and wafer with respect to each other.

The exposure apparatus of the third embodiment overcomes the above-mentioned problem according to the following configuration.

Figure 18:
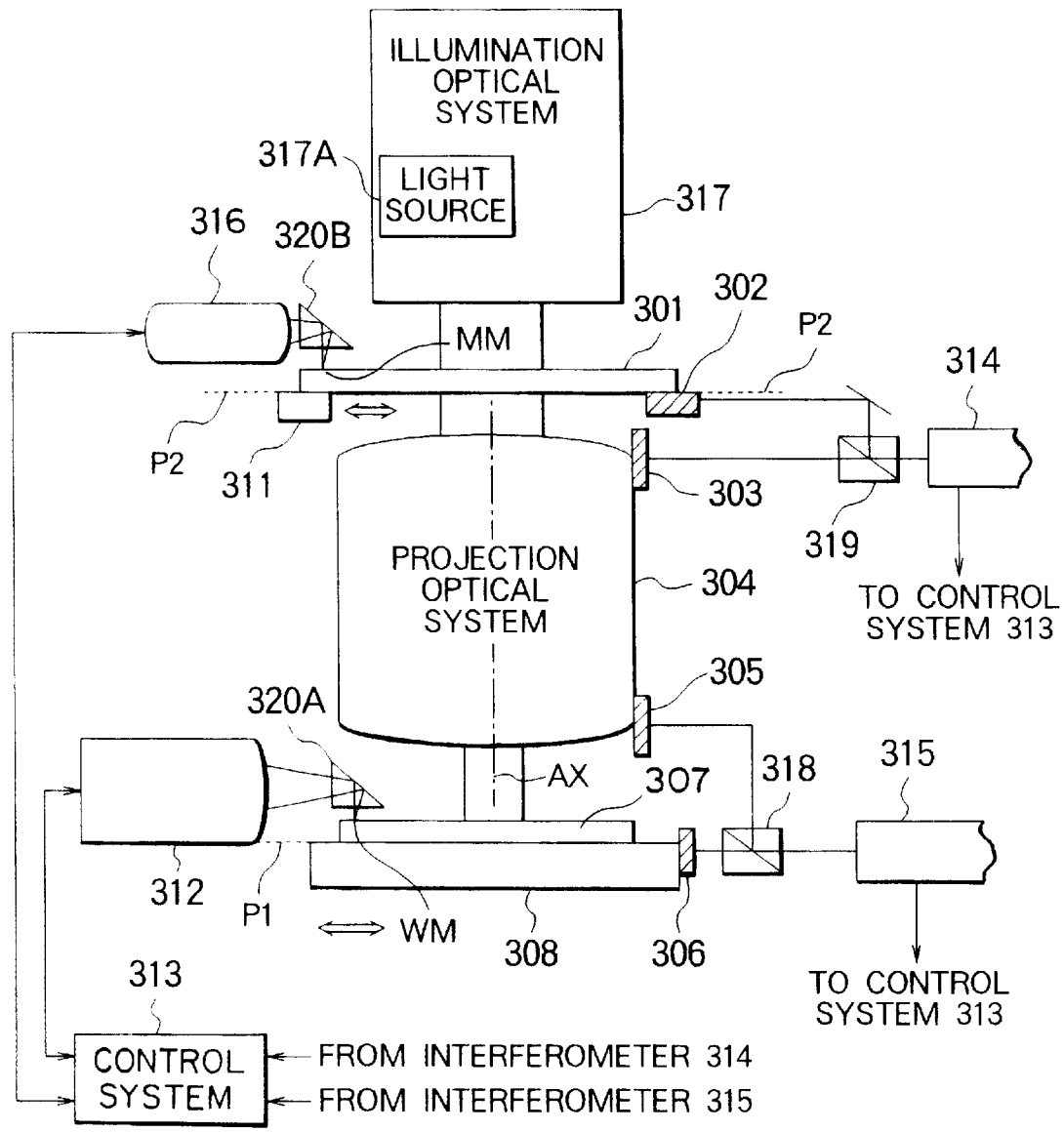
FIG. 18 is a view showing a configuration of a third embodiment of the exposure apparatus according to the present invention.

FIG. 18 is a view schematically showing a configuration of the third embodiment of the exposure apparatus according to the present invention. The third embodiment relates to so-called lens scan type scanning projection exposure apparatus in which exposure is effected while each of a mask 301 and a wafer 307 is relatively moved with respect to a projection optical system 304.

In FIG. 18, z axis is set in parallel to an optical axis AX of the projection optical system 304; x axis is set in parallel to the paper surface of FIG. 18 within a plane perpendicular to the optical axis AX; and y axis is set to a direction perpendicular to z axis and x axis.

The projection exposure apparatus of FIG. 18 comprises an illumination optical system 317 for uniformly illuminating the mask 301 with exposure light such as excimer laser light (with a wavelength of 249 nm or 193 nm) derived from KrF or ArF. This illumination optical system 317 includes a light source 317A. The mask 301 is supported on a mask stage 311, while the mask stage 311 is movable in x direction and y direction within xy plane which is perpendicular to the optical axis AX of the projection optical system 304. The x-direction moving amount and y-direction moving amount of the mask stage 311 are always measured by a laser interferometer 314 for detecting the position of the mask stage 311. The output of the laser interferometer 314 is supplied to a control system 313.

Light transmitted through the mask 301, in which a circuit pattern, for example, has been formed, reaches the wafer 307, which is a photosensitive substrate, by way of the projection optical system 304, whereby a pattern image of the mask 301 is formed on the wafer 307.

Here, the wafer 307 is supported on a wafer stage 308 by way of a wafer holder. The wafer stage 308 is two-dimensionally driven within xy plane which is perpendicular to the optical axis AX of the projection optical system 304. The x-direction moving amount and y-direction moving amount of the wafer stage 308 are always measured by a laser interferometer 315 for detecting the position of the wafer stage 308. The output of the laser interferometer 315 is supplied to the control system 313.

Thus, by effecting a scanning exposure operation while relatively moving each of the mask 301 and the wafer 307 with respect to the projection optical system 304 along x direction (scanning direction), the exposure apparatus transfers the pattern of the mask 301 onto an exposure area on the wafer 307. Then, by repeating the above-mentioned scanning exposure operation while successively driving the wafer 307 within xy plane in a two-dimensional manner, the apparatus successively transfers patterns of the mask 301 to the respective exposure areas of the wafer 307.

As mentioned above, the projection exposure apparatus of FIG. 18 comprises the laser interferometer 315 as a main body of a wafer stage position detection system for detecting the position of the wafer stage 308. A beam emitted from the laser interferometer 315 is split into reflected light and transmitted light by a beam splitter 318. Namely, the light transmitted through the beam splitter 318 becomes a measurement beam and is guided to a movable reflector 306 fixed to the wafer stage 308. On the other hand, the light reflected by the beam splitter 318 becomes a reference beam and is guided to a stationary reflector 305 fixed at an end of the tube of the projection optical system 304 on the wafer side.

The return light from the movable reflector 306 and the return light from the stationary reflector 305 are combined together by the beam splitter 318, and thus formed composite light enters the laser interferometer 315. Based on the interference of the reference beam and the measurement beam in the composite light with each other, the laser interferometer 315 detects the moving amount of the wafer stage 308 and, accordingly, the position of the wafer stage 308.

The projection exposure apparatus of FIG. 18 further comprises the laser interferometer 314 as a main body of a mask stage position detection system for detecting the position of the mask stage 311. A beam emitted from the laser interferometer 314 is split into two by a beam splitter 319. Namely, the light transmitted through the beam splitter 319 becomes a measurement beam and is guided to a movable reflector 302 fixed to the mask stage 311. On the other hand, the light reflected by the beam splitter 319 becomes a reference beam and is made incident on a stationary reflector 303 fixed to the tube of the projection optical system 304 on the mask side.

The return light from the movable reflector 302 and the return light from the stationary reflector 303 are combined together by the beam splitter 319, and thus formed composite light enters the laser interferometer 314. Based on the interference of the reference beam and the measurement beam with each other in the composite light, the laser interferometer 314 detects the moving amount of the mask stage 311 and, accordingly, the position of the mask stage 311.

The projection optical system of FIG. 18 further comprises a wafer observation system (wafer mark detection optical system) 312 for detecting the position of a wafer mark WM formed on the wafer 307 and a mask observation system (mask mark detection optical system) 316 for detecting the position of a mask mark MM formed on the mask 301. The wafer observation system 312 and the mask observation system 316 are optical systems having basically the same configuration. Accordingly, only the configuration and operation of the wafer observation system 312 will be explained in the following.

Figure 19:
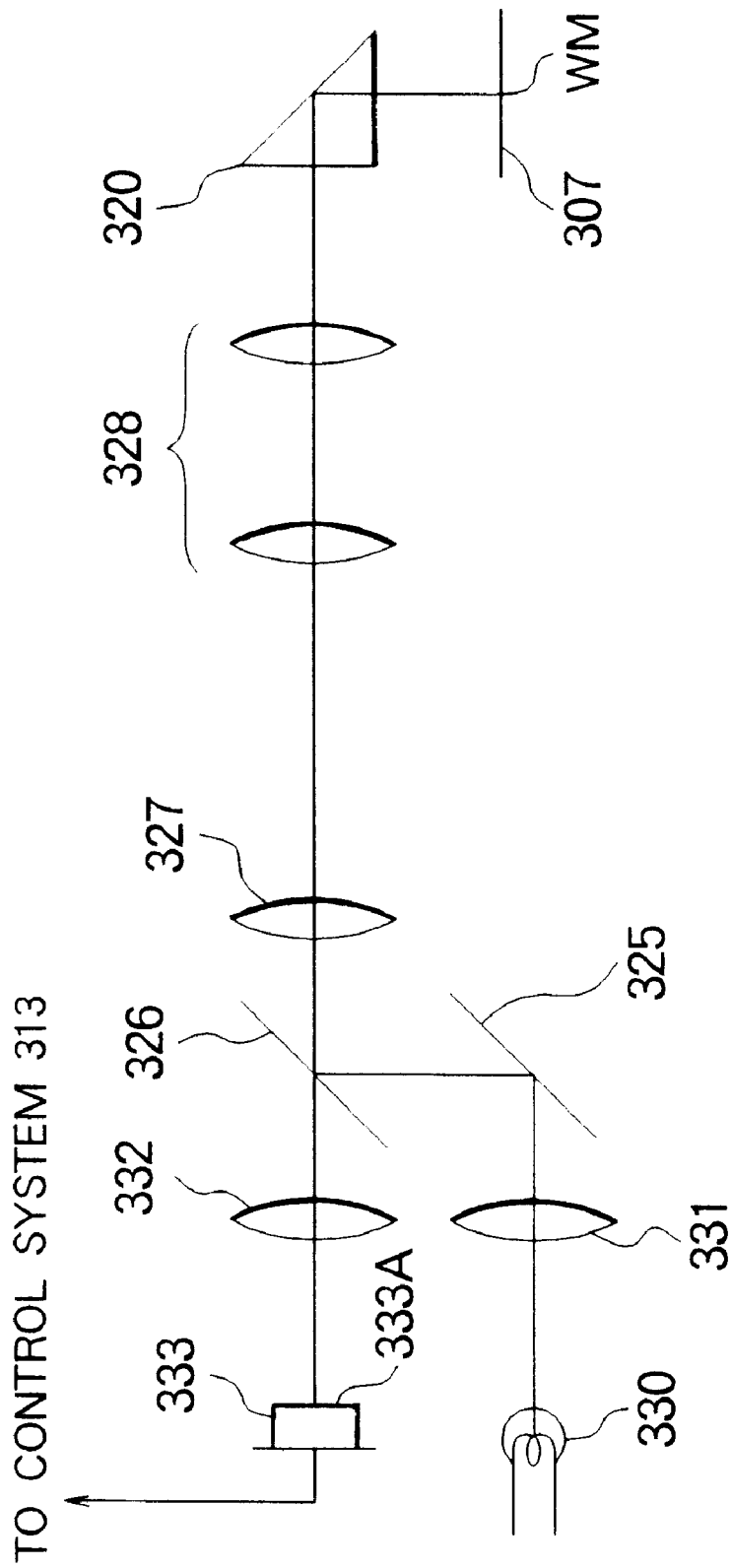
FIG. 19 is a view showing a configuration of a substrate mark position detection system 312 shown in FIG. 18.

FIG. 19 is a view schematically showing an internal configuration of the wafer observation system 312 in FIG. 18.

In FIG. 19, the wafer observation system 312 comprises a light source 330 for supplying illumination light having a broad-band wavelength (e.g., 500 to 850 nm). The illumination light from the light source 330 is collimated by a collimator lens 331 and then guided to a half mirror 325. The illumination light reflected by the half mirror 325 is guided, by way of a half mirror 326, a condenser lens 327, and a relay lens system 328, to a prism 320. The illumination light reflected by the prism 320 illuminates the wafer mark WM formed on the wafer 307.

The reflected light from the wafer mark WM is guided, by way of the prism 320, the relay lens 328, and the condenser lens 327, to the half mirror 326. The light transmitted through the half mirror 326 forms, by way of an imaging lens 332, an image on an image pickup surface 333A of an image pickup device 333 such as CCD.

Thus, on the image pickup surface 333A of the image pickup device 333, the image of the wafer mark WM is formed. The output of the image pickup device 333, namely, the output of the wafer observation system, is supplied to the control system 313. In the control system 313, on the basis of the output of the image pickup device 333, image information composed of the image of the wafer mark WM and the reference index disposed within the wafer observation system 312 is subjected to image processing, whereby the position of the wafer mark WM is detected. Since light having a relatively broad wavelength width is used for detecting the wafer mark WM in the wafer observation system 312, the influence of interference caused by the resist can be reduced.

Similarly, in the control system 313, based on the output of the mask observation system 316, image information composed of the image of the mask mark MM and the reference index disposed within the mask observation system 316 is subjected to image processing, whereby the position of the mask mark MM is detected.

Since the influence of interference caused by the resist may not be taken into account in order to detect the mask mark, it is not always necessary for the mask observation system 316 to use light having a broad wavelength width.

As explained in the foregoing, in the third embodiment, the stationary reflector 305 and the stationary reflector 303, which are reference elements, are unitedly held with the tube of the projection optical system 304 (first holding mechanism) in the laser interferometer 315 for detecting the position of the wafer stage 308 and the laser interferometer 314, respectively.

Accordingly, no substantial relative displacement occurs between the two stationary reflectors 303 and 305 due to changes in environment, vibration, or the like. As a result, unlike the conventional laser interferometer in which the stationary reflector is attached to a frame, accuracy can be prevented from lowering due to vibration or the like in the laser interferometer 314. Also, since offset drift is hard to occur between the two laser interferometers, the wafer and the mask can be positioned with respect to each other with a high accuracy.

Figure 20:
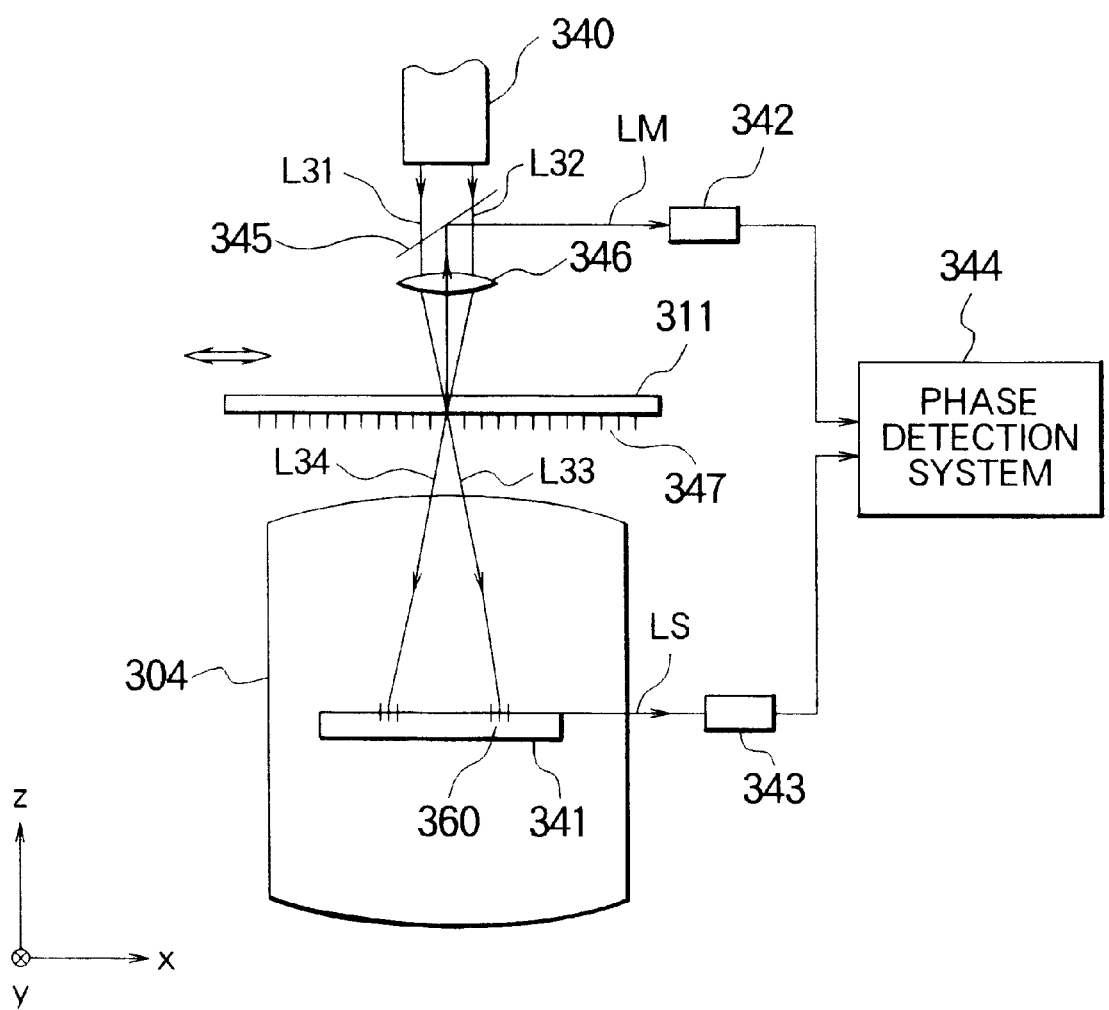
FIG. 20 is a view showing a configuration of an applied example of the mask stage position detection system shown in FIG. 18.

FIG. 20 is a view schematically showing an applied example of the third embodiment (a part of the configuration of the projection exposure apparatus). This applied example also relates to a scanning exposure type projection exposure apparatus and has a configuration similar to the embodiment of FIG. 18. This applied example differs from the embodiment of FIG. 18 only in that, as the mask position detection system, an LIA type heterodyne detection system is used in place of the laser interferometer used in the above-mentioned embodiment. Accordingly, while FIG. 20 mainly shows a configuration of the heterodyne detection system, portions not depicted have basically the same configuration as those of the embodiment of FIG. 18.

As mentioned above, in this applied example, in order to detect the position of the mask stage 311, two-luminous-flux interference technique, namely, LIA (Laser Interferometric Alignment) technique, is used. In the LIA type heterodyne detection system, two coherent luminous fluxes (laser beams, or the like) from a beam transmission system 340 (two-luminous-flux generating system) irradiate a mask stage mark 347, which is a diffraction grating, from predetermined two directions so as to form a one-dimensional interference fringe, which is then observed to specify the position of a mask mark 360.

Figure 21:
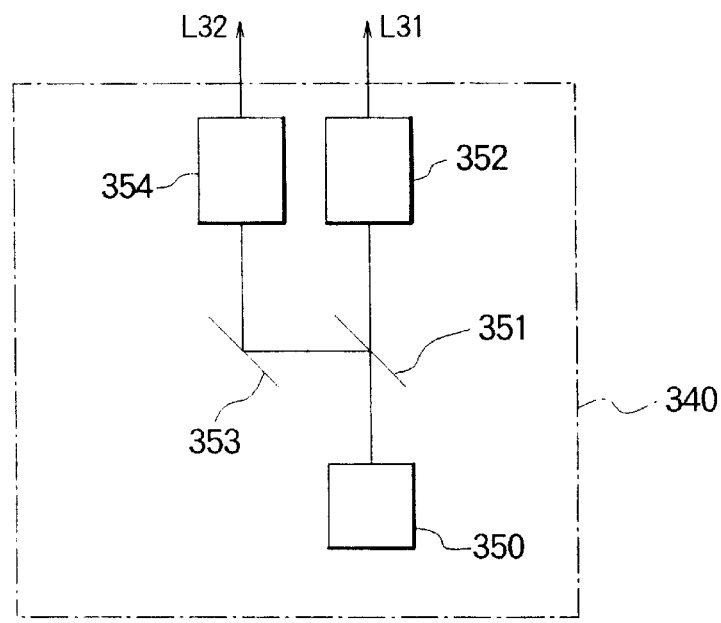
FIG. 21 is a view showing an internal configuration of a beam transmission system (two-luminous-flux generating system 340) shown in FIG. 20.

FIG. 21 is a view schematically showing an internal configuration of the beam transmission system 340 of FIG. 20.

In FIG. 21, the beam transmission system 340 comprises a laser light source 350 as a light source for supplying alignment light. As the laser light source 350, an He—Ne laser which emits light having a wavelength of 633 nm can be used, for example. A beam emitted from the laser light source 350 is split into two beams by a half mirror 351.

Namely, a beam L31 transmitted through the half mirror 351 enters a first acousto-optic device 352. On the other hand, a beam L32 reflected by the half mirror 351 enters a second acousto-optic device 354 by way of a half mirror 353.

Here, the first acousto-optic device 352 is driven by a high-frequency signal with a frequency f1, whereas the second acousto-optic device 354 is driven by a high-frequency signal with a frequency f2 (f2=f1−Δf).

Thus, the laser light source 350, the half mirror 351, the half mirror 353, the first acousto-optic device 352, and the second acousto-optic device 354 constitute the two-luminous-flux generating system 340 for generating a pair of coherent light components.

Here, the beam transmission system 340 generates and emits a pair of reference beams L33 and L34 in addition to the above-mentioned pair of detection beams L31 and L32.

With reference to FIG. 19, a pair of the detection beams L31 and L32 emitted from the beam transmission system 340 are guided to a half mirror 345. The two detection beams L31 and L32 transmitted through the half mirror 345 are converged by way of a condenser lens 346 so as to intersect (form an image) on the mask stage mark 347 formed on the mask stage 311.

Figure 22:
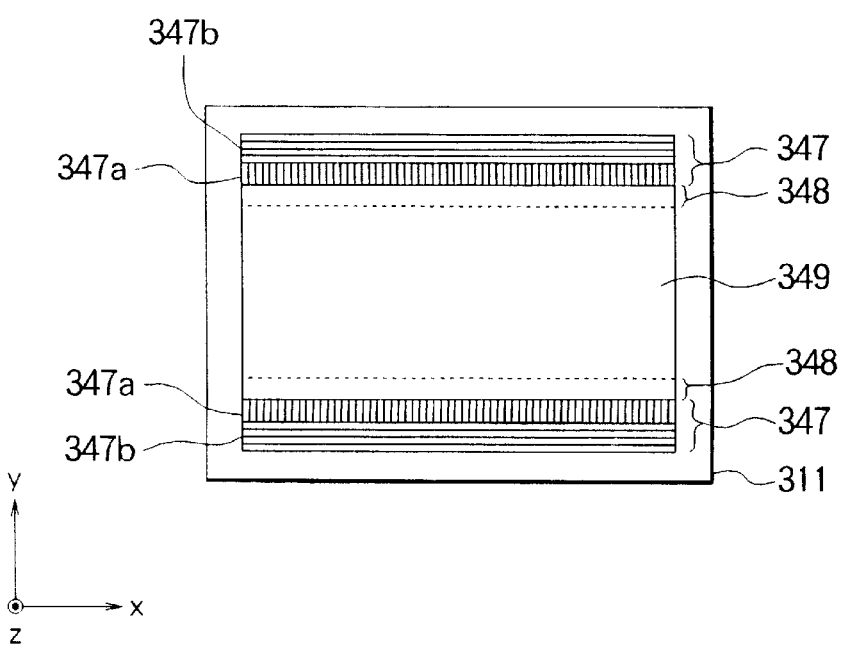
FIG. 22 is a view showing a configuration of a mask stage 311 shown in FIG. 20 and a mask stage mark disposed at this mask stage 311.

FIG. 22 is a view showing the configuration of the mask stage 311 in FIG. 20 and the mask stage mark formed thereon.

As shown in FIG. 22, at the center portion of the mask stage 311, a glass window 349 for transmitting therethrough light from a pattern area PA of the mask is positioned. Also, at both sides of the glass window 349 in y-direction, glass windows 348 for transmitting therethrough a pair of the reference beams L33 and L34 from the beam transmission system 340 along the scanning direction (x-direction) are respectively positioned.

Further, at each of the both sides of the glass window 348 in y direction, the mask stage mark 347 is formed along the scanning direction (x-direction). As shown in FIG. 22, the mask stage mark 347 comprises diffraction gratings (indexes 347a and 347b) respectively having predetermined pitches along x and y directions which are measuring directions. The diffraction gratings 347a and 347b are formed, for example, by vapor deposition at predetermined positions on a glass plate.

With reference to FIG. 20 again, a pair of the detection beams L31 and L32 which have intersected on the mask stage mark 347 are diffracted by the diffraction gratings so as to generate two±first-order diffracted light components in the normal direction (z-direction) of the mask stage 311. Thus generated two diffracted light components interfere with each other, thereby generating detection beat interference light LM.

The detection beat interference light LM from the mask stage mark 347 is guided, by way of the condenser lens 346 and the half mirror 345, to a mark signal receiving system 342. The mark signal receiving system 342 photoelectrically converts the detection beat interference light LM, thereby generating a mark signal. This mark signal is supplied to the control system 313 including a phase detection system 344.

On the other hand, a pair of reference beams L33 and L34 emitted from the beam transmission system 340 in parallel to a pair of the detection beams L31 and L32 once interfere with each other, by way of the half mirror 345 and the condenser lens 346, on the glass window 348 formed on the mask stage 311. Then, a pair of the reference beams L33 and L34 transmitted through the glass window 348 reach a plane parallel plate 341 which is a reference element disposed within the projection optical system 304.

Figure 23:
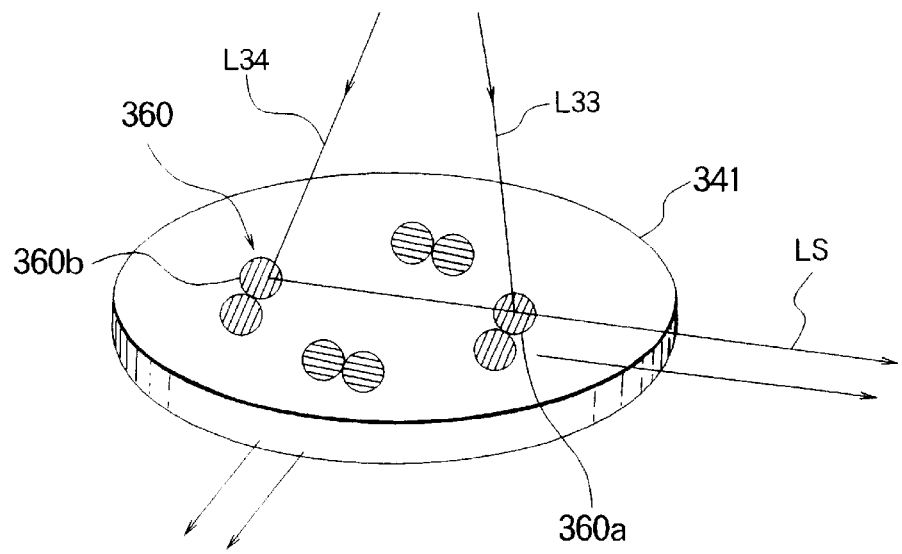
FIG. 23 is a view showing a configuration of a plane parallel plate 341 shown in FIG. 20 and a reference index disposed on this plane parallel plate 341.

FIG. 23 is a view showing a configuration of the plane parallel plate 341 of FIG. 20 and the reference mark (mask mark 360) formed thereon.

As shown in FIG. 23, on the plane parallel plate 341, a plurality of reference marks 360 each comprising a diffraction grating with a predetermined pitch arranged along each measurement direction are formed. A pair of the reference beams L33 and L34 are made incident on their corresponding pair of the reference marks 360a and 360b, respectively.

Of the light diffracted by the diffraction gratings of a pair of the reference marks 360a and 360b with respect to a pair of the reference beams L33 and L34, high-order diffracted light components having a diffraction angle exceeding 90° become an evanescent wave and propagate on the plane parallel plate 341 along the same direction as shown in FIG. 23. Thus, the high-order diffracted light component with respect to the reference beam L33 and the high-order diffracted light component with respect to the reference beam L34 are combined together and thus formed composite light is guided as reference beat interference light LS to a reference signal receiving system 343. The reference signal receiving system 343 photoelectrically converts the reference beat interference light LS into a reference signal. Thus generated reference signal issupplied to the control system 313 including the phase detection system 344.

Thus, the control system 313 detects the phase difference of the mark signal from the phase of the reference signal. Then, based on thus detected phase difference, the position of the mask stage mark 347 and, accordingly, the position of the mask stage 311 can be detected.

Figure 24:
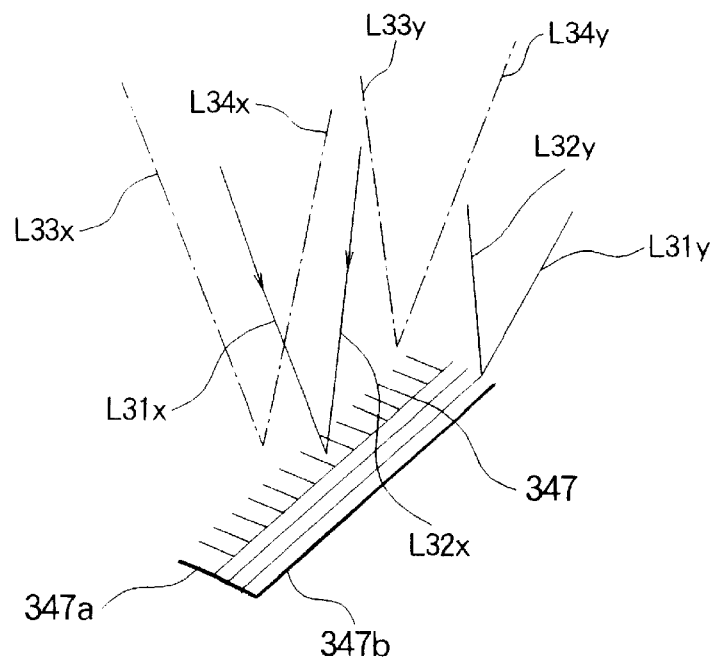
FIG. 24 is a view for explaining an operation by which positional detections are simultaneously effected along two directions in the applied example shown in FIG. 20.

The foregoing explanation relates to positional detection along one measuring direction with reference to a pair of the detection beams L31 and L32 and a pair of the reference beams L33 and L34. In the case where positional detections are simultaneously effected along two measuring directions, however, as shown in FIG. 24, the position in x-direction is detected with reference to a pair of detection beams $L31_x$ and $L32_x$ and a pair of reference beams $L33_x$ and $L34_x$. Also, the position in y direction is detected with reference to a pair of detection beams $L31_y$ and $L32_y$ and a pair of reference beams $L33_y$ and $L34_y$.

Thus, in this applied example, the stationary reflector 305, which is a reference element of the laser interferometer 315, is fixed to the tube of the projection optical system 304 on the wafer side. On the other hand, the plane parallel plate 341, which is a reference element of the heterodyne detection system for detecting the position of the mask stage, is fixed within the projection optical system 304.

Accordingly, no substantial relative displacement occurs between the two reference elements. As a result, like the embodiment of FIG. 18, highly accurate detection of the mask stage 311 and highly accurate positioning of the wafer 307 and the mask 301 with respect to each other can be effected.

In particular, in the applied example in FIG. 20, since the plane parallel plate 341, which is a reference element, is disposed within the projection optical system 304, offset drift is harder to occur than in the embodiment of FIG. 18 in which the stationary reflector 303 is attached to the tube of the projection optical system 304.

Also in the case where a lens in the upper portion of the tube in the lens group constituting the projection optical system 304 is moved (tilted or shifted) to correct magnification, the applied example of FIG. 20, in which the plane parallel plate 341 is disposed as a reference element within the projection optical system 304, is preferable since the reference element is harder to be influenced by the movement of the lens.

Preferably, the form (depth of the groove) of the reference mark 360 is defined such that the diffraction efficiency with respect to exposure light becomes substantially zero in order to prevent the imaging performance of the projection optical system 304 with respect to the exposure light from being unfavorably influenced thereby.

Also, while the reference mark 360 is formed on the plane parallel plate 341 which is disposed within the projection optical system 304 in the adopted example in FIG. 20, it may be formed on a lens surface constituting the projection optical system 304.

Further, while the embodiment of FIG. 18 and its adopted example in FIG. 20 show examples of the lens scan type scanning projection exposure apparatus, they may be other typical projection exposure apparatuses.

Also, while the above-mentioned embodiments show examples of the projection exposure apparatus using excimer laser light as exposure light, typical projection exposure apparatuses using other kinds of exposure light may be configured in a similar manner.

As explained in the foregoing, the present invention comprises a holding means for unitedly holding the first reference index, which is a reference element for the mask stage position detection system, and the second reference index, which is a reference element for the substrate stage position detection system. Accordingly, accuracy in the mask stage position detection system is prevented from lowering and offset drift is prevented from occurring between the mask stage position detection system and the substrate stage position detection system due to changes in temperature or vibration. As a result, the substrate and the mask can be positioned with respect to each other with a high accuracy.

In the following, the fourth embodiment of the exposure apparatus according to the present invention will be explained.

As mentioned above, the exposure apparatus currently used in practice incorporates therein an alignment system for optically positioning a mask and a substrate (wafer, glass plate, or the like), whose surface is coated with a photosensitive material, with respect to each other. As such an alignment system, an off-axis image pickup type alignment system has been known, for example. The image pickup type alignment system is also known as FIA (Field Image Alignment) system.

In the off-axis type FIA system, a wafer mark and a mask mark are respectively detected by a wafer observation system and a mask observation system, which are independent from each other, without the aid of a projection optical system. In general, when the off-axis type FIA system is adopted as the alignment system, the following alignment operation is effected.

First, prior to exposure, the wafer mark is detected by the off-axis type FIA system fixed to the projection optical system, whereby the position of the wafer is detected. Here, the offset between the projection optical system and the off-axis type FIA has been measured by another appropriate means beforehand.

Next, based on the result of the detection of the wafer position and the offset measured beforehand, the wafer stage and, accordingly, the wafer are placed at a predetermined position with respect to the projection optical system. Thus, exposure is effected while the wafer is aligned (positioned) with respect to the projection optical system. In this case, in order to position the wafer stage, an interferometer having a stationary reflector connected to the projection optical system is used. Accordingly, the stationary reflector connected to the projection optical system acts as a reference for positioning the wafer stage.

In the step scan type exposure apparatus in which each shot area in the wafer is exposed to light while the mask and the wafer are scanned with the projection optical system, the mask is also held by a movable mask stage. In this case, the off-axis type FIA system detects the mask mark so as to position the mask stage. In order to position the mask stage, an interferometer having a stationary reflector fixed to a mask stage holding element which is connected to the projection optical system is used. Accordingly, also in the case of the mask stage, the stationary reflector connected to the projection optical system acts as a reference for positioning the mask stage.

In the above-mentioned exposure apparatus, the positional control operations of the wafer and mask during exposure solely depend on the wafer stage interferometer and the mask stage interferometer, respectively. In other words, when the reference stationary reflector is displaced with respect to the projection optical system in each interferometer, an alignment error, namely, positioning error of the wafer and the mask with respect to each other, occurs, thereby lowering accuracy in transfer.

In particular, in the step scan type exposure apparatus, the movement of the mask upon a scanning operation is so large that vibration may occur in the apparatus as a whole. Due to this vibration, the stationary reflectors, which respectively act as positioning references for the wafer stage and the mask stage, may tend to be relatively displaced with respect to each other or each stationary reflector may tend to be relatively displaced with respect to the projection optical system. As a result, as mentioned above, positioning (alignment) error may occur between the mask and the wafer.

Also in the step-and-repeat type exposure apparatus, in which the respective shot areas of the wafer are successively subjected to transfer operations while only the wafer is two-dimensionally scanned, the above-mentioned positioning error due to the vibration may occur.

Further, in the step scan type exposure apparatus, both mask and wafer move with respect to the projection optical system upon exposure. Accordingly, in order to position the mask and the wafer with respect to each other during exposure, the mask mark has had to be formed on the whole surface of the mask.

Therefore, the exposure apparatus of the fourth embodiment suppresses the positioning error caused by the displacement of the stationary reflector of the interferometer due to the vibration of the whole apparatus, thereby enabling highly accurate positioning.

Figure 25:
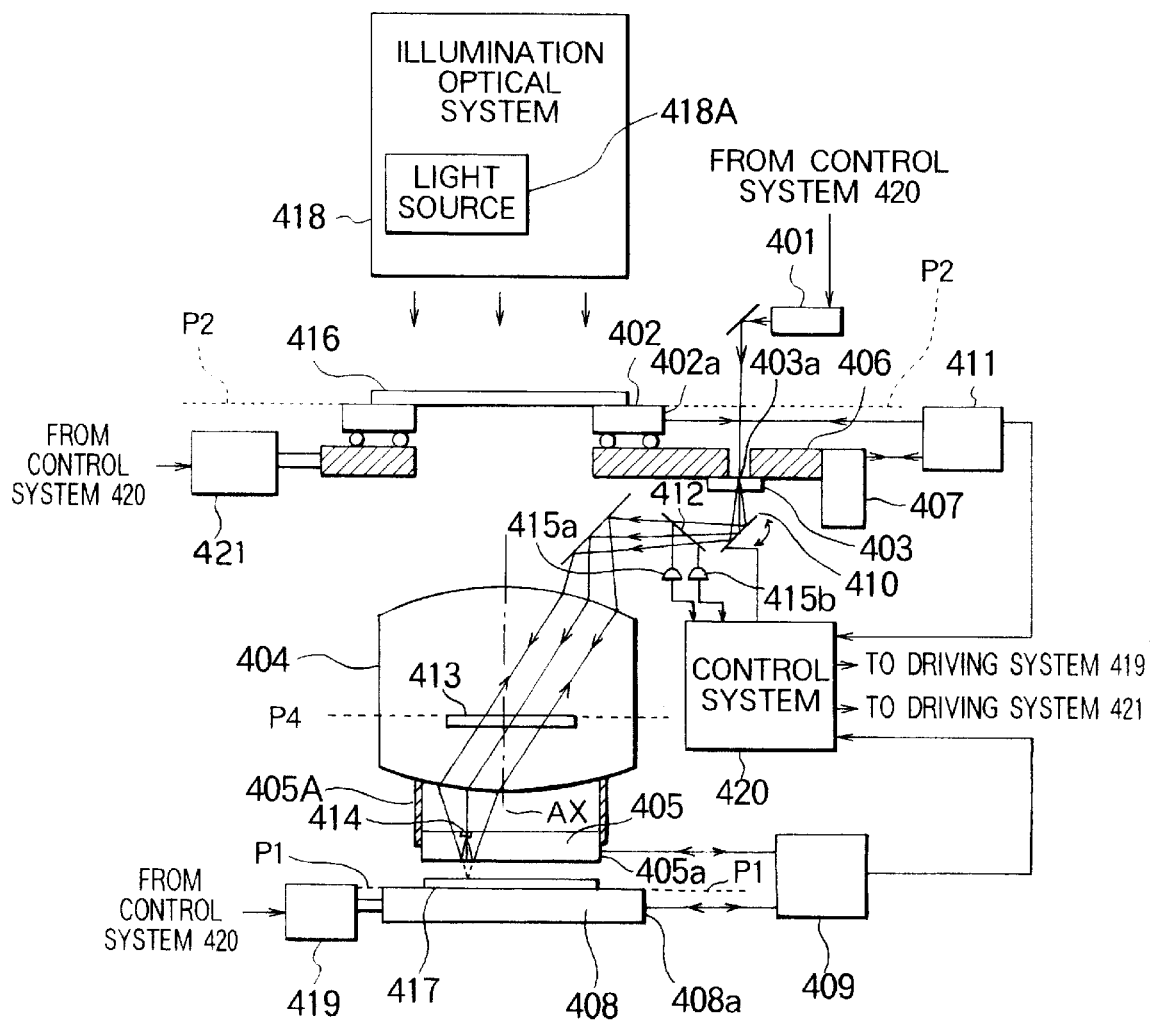
FIG. 25 is a view showing a configuration of a fourth embodiment of the exposure apparatus according to the present invention.

FIG. 25 is a view schematically showing a configuration of the fourth embodiment of the exposure apparatus according to the present invention. The embodiment shown in FIG. 25 relates to so-called step scan type scanning projection exposure apparatus in which exposure is effected while each of a mask and a wafer is relatively moved with respect to a projection optical system.

In FIG. 25, z axis is set in parallel to an optical axis AX of a projection optical system 404; x axis is set in parallel to the paper surface of FIG. 25 within a plane perpendicular to the optical axis AX; and y axis is set to a direction perpendicular to z axis and x axis.

The projection exposure apparatus of FIG. 25 comprises an illumination optical system 418 for uniformly illuminating a mask 416 with exposure light such as excimer laser light (with a wavelength of 249 nm or 193 nm) derived from KrF or ArF. This illumination optical system 418 includes a light source 418A. The mask 416 is supported on a mask stage 402. The mask stage 402 is supported by a mask stage holding element 406 connected to the projection optical system 404. The mask stage 402 can be two-dimensionally moved by a driving system 421 within xy plane which is perpendicular to the optical axis AX of the projection optical system 404. The x-direction moving amount and y-direction moving amount of the mask stage 402 are always measured by a laser interferometer 411. The output of the laser interferometer 411 is supplied to a control system 420.

Light transmitted through the mask 416, in which a circuit pattern, for example, has been formed, reaches a wafer 417, which is a photosensitive substrate, by way of the projection optical system 404, whereby a pattern image of the mask 416 is formed on the wafer 417.

Here, the wafer 417 is supported on a wafer stage 408 by way of a wafer holder. By a driving system 419, the wafer stage 408 can be two-dimensionally driven within xy plane which is perpendicular to the optical axis AX of the projection optical system 404. The x-direction moving amount and y-direction moving amount of the wafer stage 408 are always measured by a laser interferometer 409. The output of the laser interferometer 409 is supplied to the control system 420.

Thus, by effecting a scanning exposure operation while relatively moving each of the mask 416 and the wafer 417 with respect to the projection optical system 404 in x direction (scanning direction), the exposure apparatus can transfer the pattern of the mask 416 onto an exposure area on the wafer 417. Then, by repeating the above-mentioned scanning exposure operation while successively driving the wafer 417 within xy plane in a two-dimensional manner, the apparatus successively transfers patterns of the mask 416 to the respective exposure areas of the wafer 417.

As mentioned above, the projection exposure apparatus of FIG. 25 comprises the laser interferometer 409 as a main body of a wafer stage position detection system for detecting the position of the wafer stage 408. A measurement beam emitted from the laser interferometer 409 is guided to a movable reflector 408a fixed to the wafer stage 408. On the other hand, a reference beam from the laser interferometer 409 is guided to a stationary reflector 405a disposed at a reference member 405 made of an optical member attached to the projection optical system 404 on the wafer side by way of a member 405A.

The return light from the movable reflector 408a and the return light from the stationary reflector 405a are combined together and thus formed composite light enters the laser interferometer 409. Based on the interference of the composite light, the laser interferometer 409 detects the moving amount of the wafer stage 408 and, accordingly, the position of the wafer stage 408.

The projection exposure apparatus of FIG. 25 further comprises the laser interferometer 411 as a main body of a mask stage position detection system for detecting the position of the mask stage 402. A measurement beam emitted from the laser interferometer 411 is guided to a movable reflector 402a fixed to the mask stage 402. On the other hand, a reference beam from the laser interferometer 411 is guided to a stationary reflector 407 fixed to the mask stage holding element 406 (i.e., connected to the projection optical system 404).

The return light from the movable reflector 402a and the return light from the stationary reflector 407 are combined together and thus formed composite light enters the laser interferometer 411. Based on the interference of the composite light, the laser interferometer 411 detects the moving amount of the mask stage 402 and, accordingly, the position of the mask stage 402.

Thus, the laser interferometers 411 and the laser interferometer 409 can position the mask stage 402 and the wafer stage 408, respectively. The initial positioning operations for the mask stage 402 and wafer stage 408 are respectively effected by a wafer position detection system and a mask position detection system, which are not depicted, prior to exposure.

In the embodiment of FIG. 25, the relative displacement of the stationary reflector 407 and the stationary reflector 405a with respect to each other is detected by so-called heterodyne type relative displacement detection system by way of the projection optical system 404. A particular configuration of the heterodyne type relative displacement detection system is disclosed in detail in Japanese Unexamined Patent Publication No. 1-212436.

The relative displacement detection system comprises a laser light source 401 which supplies detection light having a wavelength substantially longer than that of exposure light. The detection light from the laser light source 401 illuminates a local area including a mask-side reference index 403a formed in a reference element 403 fixed to the mask stage holding element 406. The mask-side reference index 403a comprises a diffraction grating formed with a predetermined pitch along a predetermined measuring direction and is formed at a position substantially optically conjugate with the pattern forming surface of the mask 416.

As indicated by arrow in the drawing, the first-order transmitted diffracted light component and zero-order transmitted light component from the mask-side reference index 403a with respect to the detection light are, as light containing optical information about the mask-side reference index 403a, transmitted through a mirror 410 and a half mirror 412 and guided to the projection optical system 404.

In the optical path between the projection optical system 404 and the wafer 417, the light transmitted through the projection optical system 404 is made incident on the reference element 405 connected to the projection optical system 404 on the wafer side.

Figure 26:
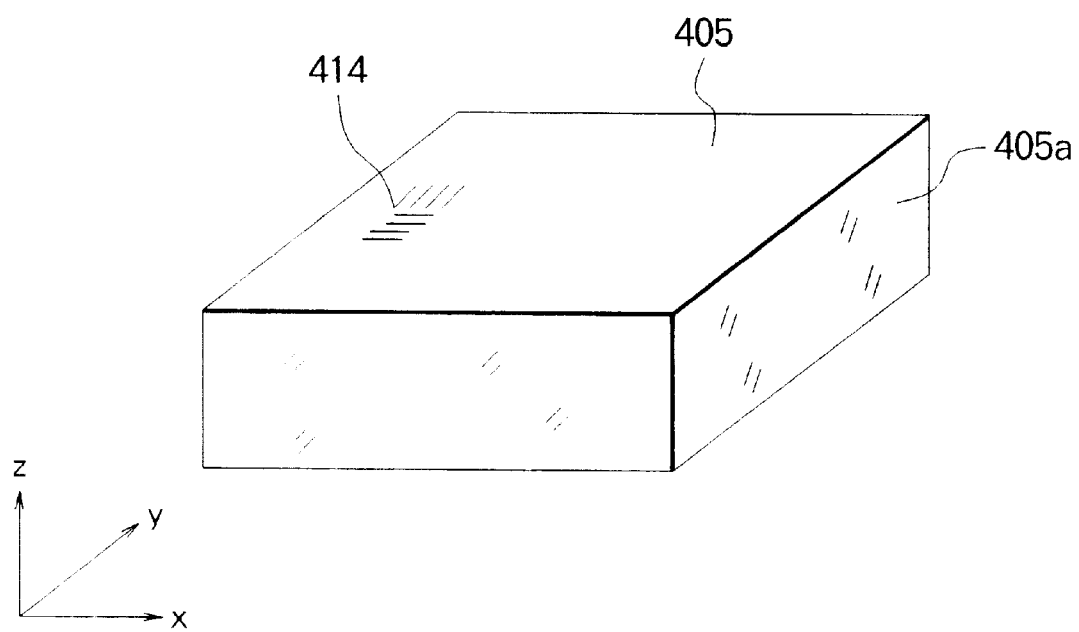
FIG. 26 is a view showing a configuration of a reference member 405 shown in FIG. 25.

FIG. 26 is a view schematically showing a configuration of the wafer-side reference element 405 of FIG. 25.

As shown in FIG. 26, the wafer-side reference element 405 is made of a glass block such as quartz, while the stationary reflector 405a is disposed at a side surface thereof. On the upper surface of the reference element 405, a reference index 414 is formed, for example, as a chromium surface is etched. The reference index 414 comprises diffraction gratings which are formed with predetermined pitches along predetermined measuring directions such as x and y directions which optically correspond to the measuring directions of the mask-side reference index 403a, respectively.

Also, the reference index 414 is formed at a position which is substantially optically conjugate with the exposure surface of the wafer 417. Thus, the wafer-side reference index 414 and the mask-side reference index 403a are disposed such that they are substantially optically conjugate with each other with respect to the projection optical system 404.

Here, in the projection optical system 404, a correction optical device (PGC) 413 for correcting chromatic aberration of the projection optical system 404, whose aberration has been corrected regarding the exposure light, with respect to the detection light is disposed on a pupil surface P4. The correction optical device 413 comprises, for example, a transparent substrate in which a diffraction grating is formed at a predetermined position.

Also, on the lower surface of the reference element 405, a thin film having a characteristic to transmit therethrough the exposure light while reflecting the detection light is formed.

Thus, the detection light incident on the reference element 405 is reflected by its lower surface and then illuminates a local area including the wafer-side reference index 414 formed on the upper surface thereof. As indicated by arrow in FIG. 25, of the detection light incident on the wafer-side reference index 414, the first-order reflected diffracted light from the wafer-side reference index 414 with respect to the zero-order transmitted light component from the mask-side reference index 403a and the zero-order reflected light component (totally reflected light component) from the wafer-side reference index 414 with respect to the first-order transmitted diffracted light component from the mask-side reference index 403a are, as light containing optical information about the mask-side reference index 403a and optical information about the wafer-side reference index 414, reflected by the lower surface of the reference element 405 and then guided to the projection optical system 404 again. By way of the projection optical system 404, the zero-order reflected light component and first-order reflected diffracted light component from the wafer-side reference index 414 are reflected by the half mirror 412 and then respectively detected by photodetectors 415a and 415b. The output signals of the photodetectors 415a and 415b are supplied to the control system 420.

By swinging the mirror 410, the control system 420 scans the wafer-side reference index 414 in a predetermined direction with detection light which has reached there by way of the mask-side reference index 403a and, in synchronization with this scanning operation, captures the output signals from the photodetectors 415a and 415b. Thus, based on the output signals from the photodetectors 415a and 415b, the control system 420 detects the relative displacement of the mask-side reference index 403a and the wafer-side reference index 414 with respect to each other and, accordingly, the relative displacement of the wafer-side stationary reflector 405a and the mask-side stationary reflector 407 with respect to each other.

In order to minimize the difference or error between the relative displacement of the mask-side reference index 403a and the wafer-side reference index 414 with respect to each other and the relative displacement of the wafer-side stationary reflector 405a and the mask-side stationary reflector 407 with respect to each other, it is desirable to form each of the pair of the reference element 405 and stationary reflector 405a and the pair of the reference element 403 and stationary reflector 407 separately as close as possible to each other or unitedly with a member having a low expansion coefficient.

In FIG. 25, the wafer-side reference element 405 and the wafer-side stationary reflector 405a are unitedly formed, whereas the mask-side reference element 403 and the mask-side stationary reflector 407 are formed separately while being close to each other. However, even in the case where the reference element 403 and the stationary reflector 407 are separated from each other, when they are connected to each other by means of a structure having a high rigidity and a low expansion coefficient while their change in temperature is suppressed to a low level, the above-mentioned error can be sufficiently suppressed.

In the embodiment of FIG. 25, as mentioned above, the relative displacement of the stationary reflector 407 substantially united with the mask-side reference index 403a and the wafer-side stationary reflector 405a united with the wafer-side reference index 414 with respect to each other is detected by way of the projection optical system 404. Based on the detected relative displacement and the measured values derived from the laser interferometer 409 and laser interferometer 411, the control system 420 supplies driving signals, in which the influence of the detected relative displacement is corrected, to the driving system 421 and the driving system 419.

Thus, in this embodiment, based on the results of measurement by the interferometers 409 and 411 and the relative displacement of the stationary reflectors 407 and 403a with respect to each other, highly accurate positioning equivalent to the TTL type positioning by way of the projection optical system 404 can be effected.

Accordingly, even when a relative displacement occurs between the stationary reflectors 407 and 403a due to a scanning operation during exposure or a relative displacement occurs between the projection optical system 404 and each stationary reflector 407 or 403a, highly accurate positioning in which the influence of the relative displacement has been corrected can be effected at any time. Namely, in the positioning according to the relative displacement detection system and each interferometer, since no alignment mark formed on the wafer or on the mask is used, highly accurate positioning can be effected at any time even during exposure.

In the above-mentioned embodiment, a heterodyne type detection system is used as the relative displacement detection system. However, other than this system, a detection system of two-luminous-flux interference technique, namely, LIA (Laser Interferometric Alignment) technique, in which a reference mark (index) comprising a diffraction grating, for example, is irradiated with two coherent luminous fluxes from predetermined two directions so as to detect the reference mark, can also be used.

While the embodiment of FIG. 25 shows an example of the step scan type scanning projection exposure apparatus, it may be any of other typical projection exposure apparatuses.

Also, while the embodiment of FIG. 25 shows an example of the projection exposure apparatus using excimer laser light as exposure light, typical projection exposure apparatuses using other kinds of exposure light may be configured in a similar manner.

In the embodiment of FIG. 25, the initial setting for positioning the mask and wafer can be effected by an off-axis optical system disclosed in the specification and drawings of Japanese Patent Application No. 7-158570. In this case, when the reference element 405 of the above-mentioned embodiment and the reference element disclosed in the above-mentioned application are used together, alignment with a higher accuracy can be effected.

In the embodiment of FIG. 25, the mask stage is movable. However, even in the case where the mask stage is stationary with no interferometer on the mask side, highly accurate alignment can be effected when the relative displacement of the mask-side reference mark fixed to the stage holding element and the wafer-side reference mark with respect to each other is detected by way of the projection optical system.

In the present invention, as explained in the foregoing, the relative displacement of the second reference member (stationary reflector 407 and reference index 403a in the above-mentioned embodiment) and the first reference member (stationary reflector 405a and reference index 414 in the above-mentioned embodiment) with respect to each other is detected by way of the projection optical system and the influence of thus detected relative displacement is corrected, whereby the positioning of the mask and the substrate with respect to each other can be effected with a high accuracy. Namely, highly accurate positioning equivalent to the TTL (through-the-lens) type positioning can be effected at any time even during exposure.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 158570/1995 (7-158570) filed on Jun. 1, 1995, 262198/1995 (7-262198) filed on Sep. 14, 1995, 333983/1995 (7-333983) filed on Nov. 29, 1995, and 333985/1995 (7-333985) filed on Nov. 29, 1995, are hereby incorporated by reference.

What is claimed is:

1. An exposure apparatus comprising:
   an illumination optical system for irradiating a mask having a predetermined pattern with exposure light having a predetermined wavelength;
   a first stage allowing a substrate whose surface is coated with a photosensitive material to be held on a main surface thereof;
   a second stage allowing said mask to be held on a main surface thereof;
   a projection optical system for projecting an image of said predetermined pattern on said mask onto said substrate surface, said projection optical system being provided between said first stage and said second stage; and
   an alignment system for detecting a relative position of said substrate and said mask with respect to each other, said alignment system comprising:
   a first stage position detection system which utilizes a first stage mark disposed at a predetermined position of said first stage and a first reference index so as to specify a position of said first stage;
   a second stage position detection system which utilizes a second stage mark disposed at said second stage and a second reference index so as to specify a position of said second stage;
   a holding mechanism which, while holding said first reference index and said second reference index, prevents disposed positions of said first reference index and second reference index from fluctuating with respect to each other;
   a first mark detection optical system which guides first detection light to said first stage mark without making said first detection light pass through said projection optical system and guides said first detection light from said first stage mark to a first light-receiving surface without making said first detection light pass through said projection optical system;
   a second mark detection optical system which guides second detection light to said second stage mark without making said second detection light pass through said projection optical system and guides said second detection light from said second stage mark to a second light-receiving surface without making said second detection light pass through said projection optical system;
   a substrate mark detection system for detecting a substrate mark formed on said substrate by using first observation light with a plurality of wavelengths without making said first observation light pass through said projection optical system, said substrate mark detection system including a substrate mark reference index so as to obtain relative position information between said substrate mark and said substrate mark reference index;
   a mask mark detection system for detecting a mask mark formed on said mask by using second observation light; and
   a control system for processing output information from said first stage position system, said second stage position system, said substrate mark detection system and said mask mark detection system so as to align between said substrate and said mask.

2. An exposure apparatus according to claim 1, wherein said holding mechanism specifies disposed positions of said first reference index and second reference index with respect to said projection optical system.

3. An exposure apparatus according to claim 1, wherein an illumination area of said illumination optical system on said substrate is positioned within an effective field of said projection optical system corresponding to an area on said substrate where light passing through said projection optical system can reach, the illumination area of said illumination optical system being smaller than the effective field of said projection optical system; and
   wherein detection fields of said substrate mark detection system and said mask mark detection system are positioned at an area within the effective field of said projection optical system on said substrate excluding the illumination area of said illumination optical system, said detection fields corresponding to areas on said substrate to be detected by said substrate mark detection system and said mask mark detection system.

4. An exposure apparatus according to claim 1, wherein said first stage position detection system includes a first interferometer which makes measurement light, which is propagated through a measurement light path including a first movable reflector fixed at a predetermined position of said first stage, and reference light, which is propagated through a reference light path including a first stationary reflector whose position with respect to said projection optical system is defined, interfere with each other and then, based on interference light thus obtained, specifies the position of said first stage with respect to said projection optical system;

wherein said first stage mark includes a reflective surface of said first movable reflector in said first interferometer; and wherein said first reference index includes a reflective surface of said first stationary reflector in said first interferometer.

5. An exposure apparatus according to claim 1, wherein said second stage position detection system includes a second interferometer which makes measurement light, which is propagated through a measurement light path including a second movable reflector fixed at a predetermined position of said second stage, and reference light, which is propagated through a reference light path including a second stationary reflector whose position with respect to said projection optical system is defined, interfere with each other and then, based on interference light thus obtained, specifies the position of said second stage with respect to said projection optical system;

wherein said second stage mark includes a reflective surface of said second movable reflector in said second interferometer; and wherein said second reference index includes a reflective surface of said second stationary reflector in said second interferometer.

6. An exposure apparatus according to claim 1, wherein said second stage mark is a first diffraction grating having a predetermined pitch arranged along a predetermined direction;

wherein said reference index is a second diffraction grating having a predetermined pitch arranged along a direction corresponding to said predetermined direction; and wherein said second stage position detection system comprises:

a two-luminous-flux generating system for generating a pair of coherent detection light components and a pair of coherent reference light components; and photodetectors for respectively receiving diffracted light from said first diffraction grating with respect to said pair of detection light components and diffracted light from said second diffraction grating with respect to said pair of reference light components, whereby said second stage position detection system specifies the position of said second stage with respect to said projection optical system based on output information from said photodetectors.

7. An exposure apparatus according to claim 6, wherein said second diffraction grating has a diffraction efficiency which is substantially zero with respect to said exposure light.

8. An exposure apparatus according to claim 1, wherein said second observation light includes light having a non-broadband wavelength.

9. An exposure method comprising:

preparing an exposure apparatus according to claim 1;

detecting a relative position of a substrate and a mask by using an alignment system;

illuminating said mask with exposure light by using an illumination optical system; and projecting the image of a predetermined pattern on said mask by using a projection optical system.

10. An exposure method comprising:

preparing an exposure apparatus according to claim 2;

detecting a relative position of a substrate and a mask by using an alignment system;

illuminating said mask with exposure light by using an illumination optical system; and projecting an image of a predetermined pattern on said mask by using a projection optical system.

11. An exposure method comprising:

preparing an exposure apparatus according to claim 8;

detecting a relative position of a substrate and a mask by using an alignment system;

illuminating said mask with the exposure light by using an illumination optical system; and projecting an image of a predetermined pattern on said mask by using a projection optical system.

* * * * *